US010645850B2

(12) United States Patent
Kagawa

(10) Patent No.: US 10,645,850 B2
(45) Date of Patent: *May 5, 2020

(54) ELECTROMAGNETIC-WAVE-ABSORBING COMPOSITE SHEET

(71) Applicants: Seiji Kagawa, Koshigaya-shi, Saitama (JP); Atsuko Kagawa, Koshigaya-shi, Saitama (JP)

(72) Inventor: Seiji Kagawa, Koshigaya (JP)

(73) Assignees: Seiji Kagawa, Koshigaya-shi (JP); Atsuko Kagawa, Koshigaya-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/351,752

(22) Filed: Mar. 13, 2019

(65) Prior Publication Data

US 2020/0015392 A1    Jan. 9, 2020

(30) Foreign Application Priority Data

Jul. 3, 2018 (JP) .................................. 2018-127168

(51) Int. Cl.
*H05K 9/00* (2006.01)

(52) U.S. Cl.
CPC ......... *H05K 9/0088* (2013.01); *H05K 9/0062* (2013.01); *H05K 9/0069* (2013.01)

(58) Field of Classification Search
CPC ........................... H05K 9/0088; H05K 9/0084
See application file for complete search history.

(56) References Cited

U.S. PATENT DOCUMENTS

| 2009/0075068 | A1* | 3/2009 | Pyo | ......................... B32B 15/08 |
| | | | | 428/336 |
| 2011/0008580 | A1 | 1/2011 | Kagawa et al. | |
| 2015/0027771 | A1 | 1/2015 | Kagawa | |
| 2016/0286698 | A1* | 9/2016 | Chang | .................. H05K 9/0083 |
| 2017/0002488 | A1* | 1/2017 | Tanaka | ...................... B32B 5/02 |
| 2017/0311448 | A1* | 10/2017 | Kawabata | ............. H01F 1/0306 |
| 2019/0215994 | A1* | 7/2019 | Hiroi | ....................... B32B 15/08 |

FOREIGN PATENT DOCUMENTS

| WO | WO 2010/093027 A1 | 8/2010 |
| WO | WO 2013/081043 A1 | 6/2013 |

* cited by examiner

*Primary Examiner* — Hung V Ngo
(74) *Attorney, Agent, or Firm* — Birch, Stewart, Kolasch & Birch, LLP

(57) ABSTRACT

An electromagnetic-wave-absorbing composite sheet contains an electromagnetic-wave-absorbing film, and an electromagnetic-wave-shielding film laminated on the electromagnetic-wave-absorbing film, wherein the electromagnetic-wave-absorbing film is formed of a thin Ni or conductive polymer film having surface resistance in a range of 50-200 Ω/square, which is disposed on a surface of a plastic film, and an area ratio of the electromagnetic-wave-shielding film to the electromagnetic-wave-absorbing film is 10-80%.

4 Claims, 20 Drawing Sheets

Sample 21 (51)        Sample 22 (52)

ELECTROMAGNETIC-WAVE-ABSORBING COMPOSITE SHEET

FIELD OF THE INVENTION

The present invention relates to an electromagnetic-wave-absorbing composite sheet having high absorbability to electromagnetic wave noises in a desired frequency range, and capable of shifting a frequency range in which electromagnetic wave noise absorbability is maximized.

BACKGROUND OF THE INVENTION

Electric appliances and electronic appliances emit electromagnetic wave noises, and ambient electromagnetic wave noises intrude into them so that noises are contained in signals. To prevent the emission and intrusion of electromagnetic wave noises, electric appliances and electronic appliances have conventionally been shielded with metal sheets. It is also proposed to dispose electromagnetic-wave-absorbing films in electric appliances and electronic appliances to absorb electromagnetic wave noises.

For example, WO 2010/093027 A1 discloses a linear-scratched, thin metal film-plastic composite film with reduced anisotropy in electromagnetic wave absorbability, which comprises a plastic film and a single- or multi-layer, thin metal film formed on at least one surface of the plastic film, the thin metal film being provided with large numbers of substantially parallel, intermittent linear scratches with irregular widths and intervals in plural directions, and the thin metal film being made of aluminum, copper, nickel, or alloys thereof. WO 2010/093027 A1 describes that the linear-scratched, thin metal film-plastic composite film can be laminated with an electromagnetic wave reflector (a sheet, net or mesh of metal, a plastic film having a thin metal film, etc.) via a dielectric layer to obtain a composite electromagnetic wave absorber. This composite electromagnetic wave absorber has high absorbability to electromagnetic wave noise in a wide frequency, but does not have a function of exhibiting particularly large absorbability to electromagnetic wave noise at a particular frequency, and a function of shifting a frequency range in which the electromagnetic wave noise absorbability is maximized.

WO 2013/081043 A1 discloses an electromagnetic-wave-absorbing composite sheet comprising (a) a first electromagnetic-wave-absorbing film comprising a plastic film, and a single- or multi-layer, thin metal film formed on at least one surface of the plastic film, the thin metal film being made of at least one metal selected from the group consisting of aluminum, copper, silver, tin, nickel, cobalt, chromium and alloys thereof, and the thin metal film being provided with large numbers of substantially parallel, intermittent linear scratches with irregular widths and intervals in plural directions; and (b) a second electromagnetic-wave-absorbing film comprising magnetic particles or non-magnetic conductive particles dispersed in a resin or a rubber. This electromagnetic-wave-absorbing composite sheet has high absorbability to electromagnetic wave noise in a wide frequency range, but does not have a function of exhibiting particularly large absorbability to electromagnetic wave noise at a particular frequency, and a function of shifting a frequency range in which the electromagnetic wave noise absorbability is maximized.

OBJECT OF THE INVENTION

Accordingly, the object of the present invention is to provide an electromagnetic-wave-absorbing composite sheet having high absorbability to electromagnetic wave noises in a desired frequency range, and capable of shifting a frequency range in which electromagnetic wave noise absorbability is maximized.

DISCLOSURE OF THE INVENTION

As a result of intensive research in view of the above object, the inventor has found that an electromagnetic-wave-absorbing composite sheet having high absorbability to electromagnetic wave noises in a desired frequency range, and capable of shifting a frequency range in which electromagnetic wave noise absorbability is maximized can be obtained by laminating an electromagnetic-wave-shielding film on an electromagnetic-wave-absorbing film having a thin Ni or conductive polymer film, and setting an area ratio of the electromagnetic-wave-shielding film to the electromagnetic-wave-absorbing film to 10-80%. The present invention has been completed based on such finding.

Thus, the electromagnetic-wave-absorbing composite sheet of the present invention comprises an electromagnetic-wave-absorbing film, and an electromagnetic-wave-shielding film laminated on the electromagnetic-wave-absorbing film;

the electromagnetic-wave-absorbing film comprising a thin Ni or conductive polymer film having surface resistance in a range of 50-200 Ω/square, which is formed on a surface of a plastic film; and an area ratio of the electromagnetic-wave-shielding film to the electromagnetic-wave-absorbing film being 10-80%.

The area ratio of the electromagnetic-wave-shielding film to the electromagnetic-wave-absorbing film is preferably 20-80%, more preferably 30-70%, further preferably 40-65%, most preferably 45-60%.

The electromagnetic-wave-shielding film is preferably a conductive metal foil, a plastic film having a thin conductive metal film or coating, or a carbon sheet.

The conductive metal in the electromagnetic-wave-shielding film is preferably at least one selected from the group consisting of aluminum, copper, silver, tin, nickel, cobalt, chromium and their alloys.

Both of the electromagnetic-wave-absorbing film and the electromagnetic-wave-shielding film are preferably in a rectangular or square shape.

DESCRIPTION OF THE PREFERRED EMBODIMENTS

The embodiments of the present invention will be explained in detail referring to the attached drawings, and it should be noted that explanations concerning one embodiment are applicable to other embodiments unless otherwise mentioned. Also, the following explanations are not restrictive, but various modifications may be made within the scope of the present invention.

Figure 1A:
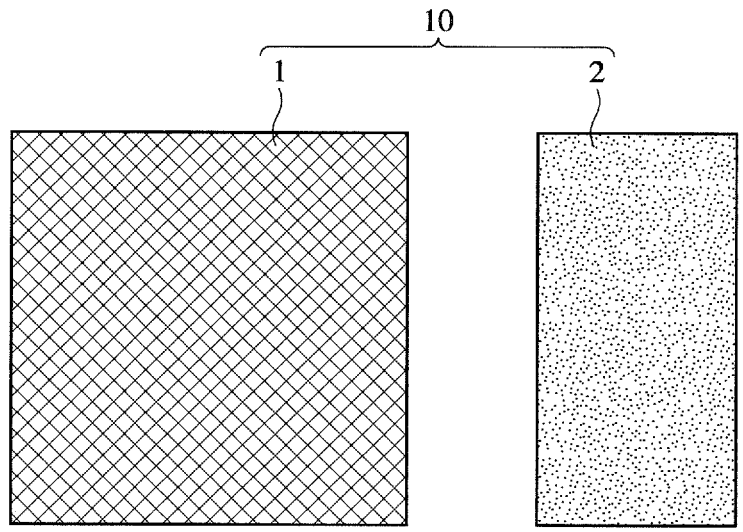
FIG. 1(a) is an exploded plan view showing an example of the electromagnetic-wave-absorbing composite sheets of the present invention.
Figure 1B:
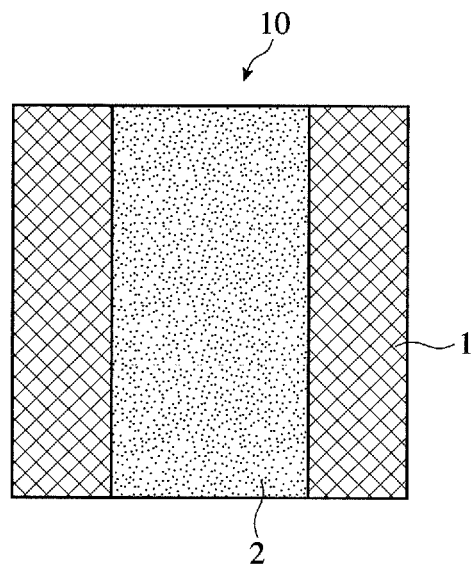
FIG. 1(b) is a plan view showing an example of the electromagnetic-wave-absorbing composite sheets of the present invention.

FIG. 1(a) shows an electromagnetic-wave-absorbing film 1, and an electromagnetic-wave-shielding film 2 laminated on the electromagnetic-wave-absorbing film 1, which constitute the electromagnetic-wave-absorbing composite sheet 10 of the present invention, and FIG. 1(b) shows an example of the electromagnetic-wave-absorbing composite sheets 10 of the present invention constituted by the electromagnetic-wave-absorbing film 1 and the electromagnetic-wave-shielding film 2.

[1] Electromagnetic-Wave-Absorbing Film

Figure 2:
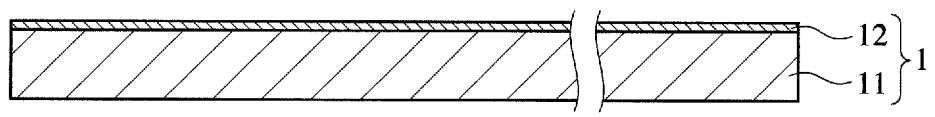
FIG. 2 is a cross-sectional view showing an example of electromagnetic-wave-absorbing films constituting the electromagnetic-wave-absorbing composite sheet of the present invention.

As shown in FIG. 2, the electromagnetic-wave-absorbing film 1 comprises a plastic film 11, and a thin film 12 having surface resistance in a range of 50-200 Ω/square, which is formed on a surface of the plastic film 11. As the thin film 12 having surface resistance in a range of 50-200 Ω/square, a thin Ni film and a thin conductive polymer film are included.

Resins forming the plastic film 11 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. From the aspect of strength and cost, polyethylene terephthalate (PET) is preferable. The thickness of the plastic film 11 may be about 8-30 μm.

(1) Thin Ni Film

The thickness of the thin Ni film is preferably 5-100 nm, more preferably 10-50 nm, most preferably 10-30 nm. Such a thin Ni film can be produced by vapor deposition methods (physical vapor deposition methods such as a vacuum vapor deposition method, a sputtering method and an ion plating method, or chemical vapor deposition methods such as a plasma CVD method, a thermal CVD method and a photo CVD method), plating methods, or foil-bonding methods.

Figure 3:
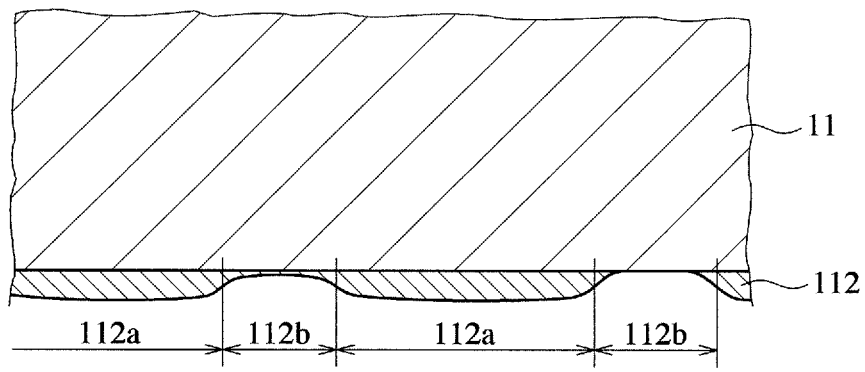
FIG. 3 is a partial cross-sectional view showing the details of a thin Ni film in the electromagnetic-wave-absorbing film.

As shown in FIG. 3, a thin Ni film 112 as extremely thin as 5-100 nm has uneven thickness, having thick regions 112a and thin or Ni-free regions 112b. Accordingly, it is difficult to measure the thickness of the thin Ni film 112 accurately. Thus, the thickness of the thin Ni film 112 may be expressed by the transmittance of a laser ray having a wavelength of 660 nm (simply called "light transmittance"). The light transmittance is determined by averaging values measured at plural arbitrary points of the thin Ni film 112. When measured at 5 or more points, the average of the measured light transmittance values is stabilized. Because the plastic film 11 as thin as 30 μm or less has light transmittance of almost 100%, the light transmittance of the electromagnetic-wave-absorbing film 12 is equal to that of the thin Ni film 112. However, when the plastic film 11 is thicker than 30 μm, the light transmittance of the thin Ni film 112 is determined by subtracting the light transmittance of the plastic film 11 from the light transmittance of the electromagnetic-wave-absorbing film 12.

The light transmittance of the thin Ni film 112 is preferably in a range of 3-50%. When the light transmittance is less than 3%, the thin Ni film 112 is too thick, functioning like a metal foil, resulting in high reflectance of electromagnetic waves and low absorbability of electromagnetic wave noises. On the other hand, when the light transmittance is more than 50%, the thin Ni film 112 is too thin, resulting in insufficient electromagnetic wave absorbability. The light transmittance of the thin Ni film 112 is more preferably 5-45%, most preferably 8-30%.

Figure 4A:
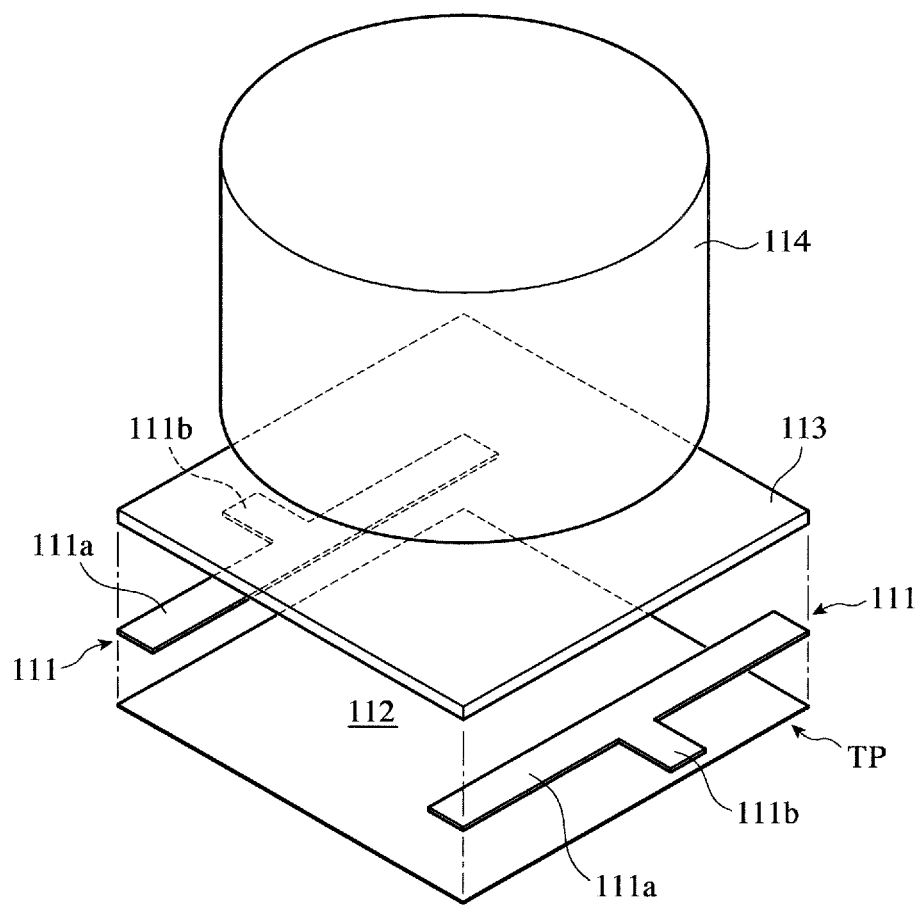
FIG. 4(a) is a perspective view showing an apparatus for measuring the surface resistance of an electromagnetic-wave-absorbing film.
Figure 4B:
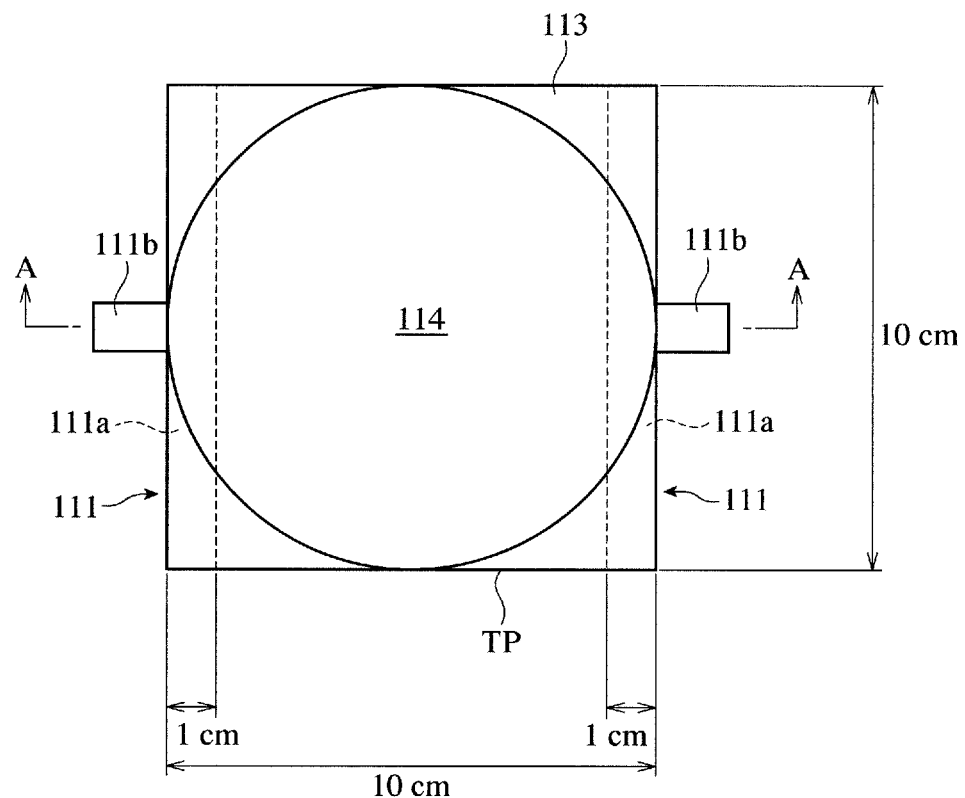
FIG. 4(b) is a plan view showing the measurement of the surface resistance of an electromagnetic-wave-absorbing film by the apparatus of FIG. 4(a).
Figure 4C:
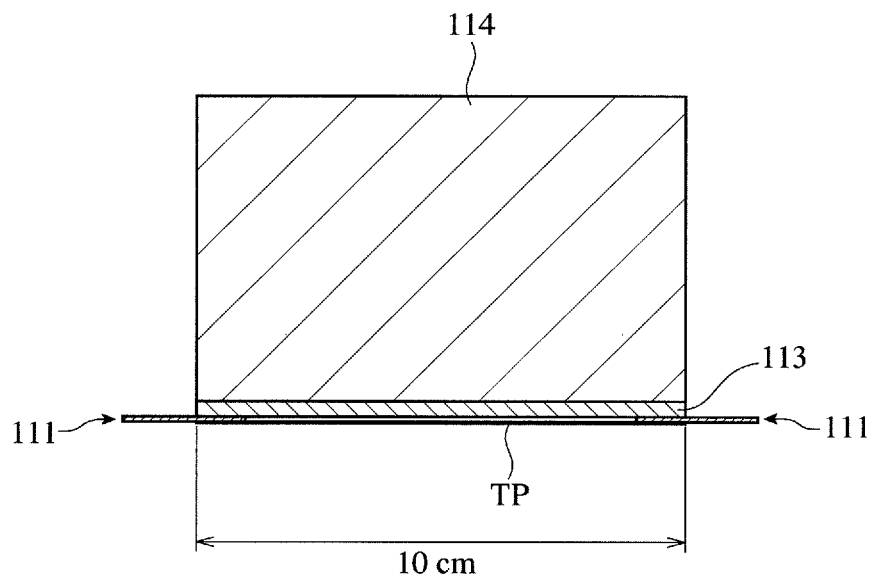
FIG. 4(c) is a cross-sectional view taken along the line A-A in FIG. 4(b).

The surface resistance of a thin Ni film 112 having light transmittance of 3-50% largely varies depending on measurement methods. To have as large a contact area as possible between the thin Ni film 112 and an electrode with close and uniform contact therebetween, the surface resistance is measured by a DC two-terminal method under pressure (simply called "pressurized two-terminal method"), using the apparatus shown in FIGS. 4(a) to 4(c). Specifically, a square test piece TP (10 cm×10 cm) of the electromagnetic-wave-absorbing film 1 is placed with its thin Ni film 112 above on a flat, hard insulation surface (not shown); a pair of electrodes 111, 111 each comprising an electrode body 111a of 10 cm in length, 1 cm in width and 0.5 mm in thickness, and an electrode extension 111b of 1 cm in width and 0.5 mm in thickness extending from a center side of the electrode body 111a are attached to opposing side portions of the square test piece TP; a transparent acrylic plate 113 of 10 cm×10 cm×5 mm is placed on the test piece TP and both electrodes 111, 111, such that it completely covers them; and a cylindrical weight 114 (3.85 kg) of 10 cm in diameter is placed on the transparent acrylic plate 113, to measure current flowing between both electrode extensions 111b, 11b to determine the surface resistance.

The surface resistance of the thin Ni film 112 should be in a range of 50-200 Ω/square. When the surface resistance is less than 50 Ω/square, the thin Ni film 112 is too thick, functioning like a metal foil, resulting in low absorbability of electromagnetic wave noises. On the other hand, when the surface resistance is more than 200~/square, the thin Ni film 112 is too thin to have sufficient electromagnetic wave absorbability. The surface resistance of the thin Ni film 112 is preferably 70-180 Ω/square, more preferably 80-150 Ω/square, most preferably 90-130 Ω/square.

As shown in FIG. 3, the extremely thin Ni film 112 is uneven in thickness as a whole, having relatively thick regions 112a and relatively thin or thin-film-free regions 112b. It is considered that the relatively thin regions 112b act as magnetic gaps and high-resistance regions, attenuating magnetic flux and current generated in the thin Ni film 112 by near-field noises. It has been found, however, that because the structure of such thin Ni film 112 largely differs depending on production conditions, it is extremely difficult to stably form a thin Ni film 112 having constant light transmittance and surface resistance. Intensive research has revealed that when a thin Ni film 112 formed by a vapor deposition method on a stretched polyethylene terephthalate film 11 is heat-treated at a temperature in a range of 110° C. to 170° C., at which the heat shrinkage of the stretched polyethylene terephthalate film 11 is likely to occur, for a short period of time (10 minutes to 1 hour), the surface resistance of the thin Ni film 112 is stabilized with slight decrease, and subject to substantially no change with time, thereby stabilizing the electromagnetic wave noise absorbability, while causing slight heat shrinkage in the stretched polyethylene terephthalate film 11. The stabilization of electromagnetic wave noise absorbability means not only that the electromagnetic wave noise absorbability is subject to substantially no change with time, but also that there is reduced unevenness depending on production conditions and among production lots.

The surface resistance can be adjusted by changing heat treatment conditions. For example, when a thin Ni film 112 has high surface resistance, a higher heat treatment temperature or a longer heat treatment time reduces the surface resistance to a desired level. Oppositely, when the thin Ni film 112 has low surface resistance, a lower heat treatment temperature or a shorter heat treatment time suppresses decrease in the surface resistance.

The heat treatment temperature is in a range of 110-170° C. When the heat treatment temperature is lower than 110° C., the heat treatment effects of improving the electromagnetic wave absorbability and reducing its unevenness are not substantially obtained. On the other hand, when the heat treatment temperature is higher than 170° C., the thin Ni film 112 is subjected to surface oxidation, with too large heat shrinkage in a polyethylene terephthalate film not having sufficient heat resistance. The heat treatment temperature is preferably 120-170° C., more preferably 130-160° C. The heat treatment time is generally 10 minutes to 1 hour, preferably 20-40 minutes, though variable depending on the heat treatment temperature.

(2) Thin Conductive Polymer Film

The thin conductive polymer film is preferably a polyaniline composite obtained by adding a dopant to substituted or unsubstituted polyaniline. The weight-average molecular weight of polyaniline is preferably 20,000 or more, more preferably 20,000-500,000. Substituent groups of polyaniline include linear or branched alkyl groups such as a methyl group, an ethyl group, a hexyl group, an octyl group, etc.; alkoxy groups such as a methoxy group, an ethoxy group, etc.; aryloxy groups such as a phenoxy group, etc.; hologenated alkyls such as a trifluoromethyl ($-CF_3$) group, etc. The substituted or unsubstituted polyaniline can be produced by polymerization in the presence of a chlorine-free acid such as phosphoric acid, etc.

Dopants for the polyaniline composite are, for example, Bronsted acids or Bronsted acid ions generated from their salts, specifically di-isooctyl sulfosuccinate, sodium di-isooctyl sulfosuccinate, etc.

The mass ratio of the dopant to polyaniline is preferably 0.35-0.65, more preferably 0.4-0.6.

The thin conductive polymer film is preferably formed by a coating method. Taking a thin polyaniline film for example, explanations will be made below, and they are applicable to other thin conductive polymer films as they are. Solvents used for preparing a polyaniline solution applied to a plastic film 11 are preferably organic solvents. The organic solvents may be hydrophilic or hydrophobic. The hydrophilic organic solvents include alcohols such as isopropanol, butanol, pentanol, etc.; ketones such as acetone, etc.; ethers such as tetrahydrofuran, dioxane, etc.; polar solvents such as N-methyl pyrrolidone, etc. The hydrophobic organic solvents include hydrocarbon solvents such as benzene, toluene, xylene, etc.; halogen-containing hydrocarbon solvents such as methylene chloride, chloroform, carbon tetrachloride, etc.; ester solvents such as ethyl acetate, n-butyl acetate, etc.; ketone solvents such as methyl ethyl ketone, cyclopentane, etc.; ether solvents such as cyclopentyl methyl ether, etc.

Like the thin Ni film, the thin conductive polymer film should have surface resistance in a range of 50-200 Ω/square. When the surface resistance is less than 50 Ω/square, the thin conductive polymer film is too thick, acting like a metal foil, resulting in low electromagnetic wave noise absorbability. On the other hand, when the surface resistance is more than 200 Ω/square, the thin conductive polymer film is too thin, also resulting in insufficient electromagnetic wave absorbability. The surface resistance of the thin conductive polymer film is preferably 70-180 Ω/square, more preferably 80-150 Ω/square, most preferably 90-130 Ω/square.

[2] Electromagnetic-Wave-Shielding Film

To reflect electromagnetic wave noise transmitting the electromagnetic-wave-absorbing film 1 and project it to the electromagnetic-wave-absorbing film 1 again, the electromagnetic-wave-shielding film 2 should have a function of reflecting electromagnetic wave noise. To exhibit such function effectively, the electromagnetic-wave-shielding film 2 is preferably a conductive metal foil, a plastic film having a thin conductive metal film or coating, or a carbon sheet. The electromagnetic-wave-absorbing film 1 and the electromagnetic-wave-shielding film 2 are preferably laminated via a non-conductive adhesive, which may be a known one.

(1) Conductive Metal Foil

The conductive metal is preferably at least one selected from the group consisting of aluminum, copper, silver, tin, nickel, cobalt, chromium and their alloys. The conductive metal foil is preferably as thick as 5-50 μm.

(2) Thin Conductive Metal Film or Coating

The thin conductive metal film is preferably a vapor-deposited film of the above conductive metal. The vapor-deposited metal film may be as thick as several tens of nanometers to several tens of micrometers. The plastic film on which a vapor-deposited film of the above conductive metal is formed may be the same as the plastic film 11 in the electromagnetic-wave-absorbing film 1.

(3) Conductive Metal Coating

The conductive metal coating can be formed by coating a plastic film with an ink (paste) comprising conductive metal powder such as silver powder, etc. highly dispersed in a thermoplastic or photocuring resin, drying the resultant coating, and then irradiating the coating with ultraviolet rays, if necessary. The conductive ink (paste) may be a known one, for example, a photocuring, conductive ink composition (JP 2016-14111 A) comprising a conductive filler, a photoinitiator, and a polymer dispersant, the percentage of the conductive filler being 70-90% by mass; and the conductive filler being silver powder having a particle size $D_{50}$ of 0.3-3.0 μm, 50% or more by mass of which is in a scale, foil or flake shape. The plastic film on which the conductive metal is coated may be the same as the plastic film 11 in the electromagnetic-wave-absorbing film 1.

(4) Carbon Sheet

The carbon sheet used as the electromagnetic-wave-shielding film is a commercially available PGS (registered trademark) graphite sheet (available from Panasonic Corporation) formed by heat-treating a polyimide film at an ultrahigh temperature in an inert gas, a carbon sheet (heat dissipation sheet) comprising graphite powder and carbon black, etc.

Usable as a carbon sheet of graphite powder/carbon black is a heat dissipation sheet (JP 2015-170660 A) having a structure in which carbon black is uniformly dispersed among fine graphite particles, with a fine graphite particles/carbon black mass ratio of 75/25-95/5, a density of 1.9 g/cm³ or more, and an in-plane thermal conductivity of 570 W/mK or more. The fine graphite particles preferably have an average diameter of 5-100 μm and an average thickness of 200 nm or more. This heat dissipation sheet is preferably as thick as 25-250 μm.

This heat dissipation sheet can be formed by a method comprising (1) preparing a dispersion containing 5-25% by mass in total of fine graphite particles and carbon black, and 0.05-2.5% by mass of a binder resin in an organic solvent, a mass ratio of the fine graphite particles to the carbon black being 75/25-95/5; (2) repeating a step of applying the dispersion to a surface of a support plate and a drying step plural times, to form a resin-containing composite sheet comprising the fine graphite particles, the carbon black, and the binder resin; (3) burning the resin-containing composite sheet to remove the binder resin; and (4) pressing the resultant composite sheet of fine graphite particles/carbon black for densification.

[3] Arrangement of Electromagnetic-Wave-absorbing Film and Electromagnetic-Wave-Shielding Film (1) Area Ratio An area ratio of the electromagnetic-wave-shielding film 2 to the electromagnetic-wave-absorbing film 1 is 10-80%. When the area ratio is less than 10% or more than 80%, the absorbability of electromagnetic wave noise in a desired frequency range is not sufficiently maximized. This is an unexpected result, and it is an important feature of the present invention that the area ratio of the electromagnetic-wave-shielding film 2 to the electromagnetic-wave-absorbing film 1 is 10-80%. The lower limit of the area ratio is preferably 20%, more preferably 30%, further preferably 40%, most preferably 45%. The upper limit of the area ratio is preferably 70%, more preferably 65%, most preferably 60%. The area ratio range of the electromagnetic-wave-shielding film 2 to the electromagnetic-wave-absorbing film 1 is, for example, preferably 20-80%, more preferably 30-70%, further preferably 40-65%, most preferably 45-60%.

(2) Position

Figure 5A:
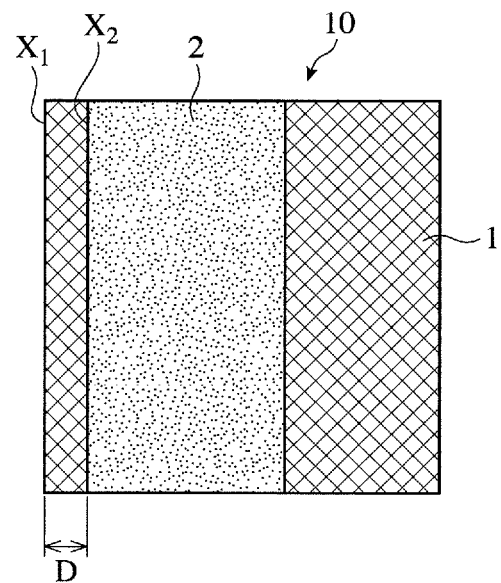
FIG. 5(a) is a plan view showing another example of the electromagnetic-wave-absorbing composite sheets of the present invention.
Figure 5B:
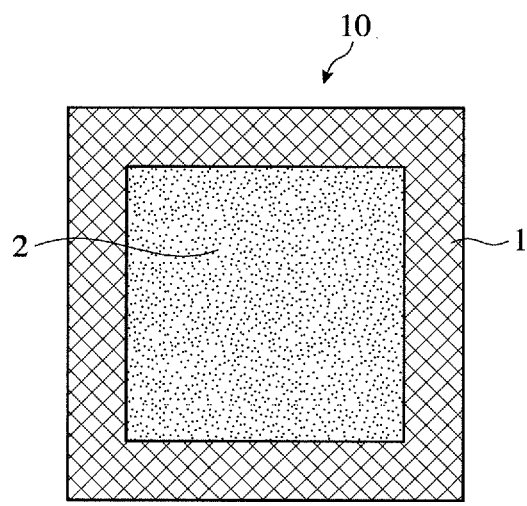
FIG. 5(b) is a plan view showing a further example of the electromagnetic-wave-absorbing composite sheets of the present invention.

A center of the electromagnetic-wave-shielding film 2 is preferably positioned at a center of the electromagnetic-wave-absorbing film 1, but it may be deviated to change a frequency at which the electromagnetic wave absorbability has a peak. The position change of the electromagnetic-wave-shielding film 2 may be conducted by shifting the electromagnetic-wave-shielding film 2 in one direction relative to the electromagnetic-wave-absorbing film 1 as shown in FIG. 5(a), or by reducing the size of the electromagnetic-wave-shielding film 2 such that four sides of the electromagnetic-wave-shielding film 2 are receding inward from four sides of the electromagnetic-wave-absorbing film 1 as shown in FIG. 5(b). In both cases, because how the electromagnetic-wave-shielding film 2 is shifted or sized relative to the electromagnetic-wave-absorbing film 1 affects a frequency at which the electromagnetic wave absorbability has a peak, it is preferably determined depending on a frequency range in which the electromagnetic wave absorbability is maximized. In any of FIGS. 5(a) and 5(b), the area ratio of the electromagnetic-wave-shielding film 2 to the electromagnetic-wave-absorbing film 1 should meet the above requirement.

The present invention will be explained in more detail referring to Examples below without intention of restricting the present invention thereto.

Example 1

A thin Ni film 112 having a thickness of 20 nm was formed on a 12-μm-thick polyethylene terephthalate (PET) film 11 by vacuum vapor deposition, to produce a long Ni-deposited film. Five test pieces TP of 10 cm×10 cm were cut out of arbitrary portions of the Ni-deposited film. The surface resistance of each test piece TP was measured by a pressurized two-terminal method as shown in FIG. 4. Each electrode 111 comprised an electrode body 111a of 10 cm in length, 1 cm in width and 0.5 mm in thickness and an electrode extension 111b of 1 cm in width and 0.5 mm in thickness, a transparent acrylic plate 113 was 10 cm×10 cm×5 mm, and a cylindrical weight 114 of 3.85 kg had a diameter of 10 cm. With both electrodes 111, 111 connected to a resistance meter (type: 3565) available from Tsuruga Electric Corporation, the surface resistance was determined from the measured current. The average surface resistance of all test pieces TP was 110 Ω/square.

Electromagnetic-wave-absorbing film pieces 1 of 50 mm×50 mm were cut out of the long Ni-deposited film, and an aluminum foil piece (thickness: 15 μm) 2 having a size of L (0 mm, 10 mm, 20 mm, 25 mm, 30 mm, 40 mm, and 50 mm)×50 mm was laminated via a non-conductive adhesive on each electromagnetic-wave-absorbing film piece 1, to produce Samples 1-7. In each Sample, a center of the aluminum foil piece 2 was aligned with a center of the electromagnetic-wave-absorbing film piece 1.

Figure 6A:
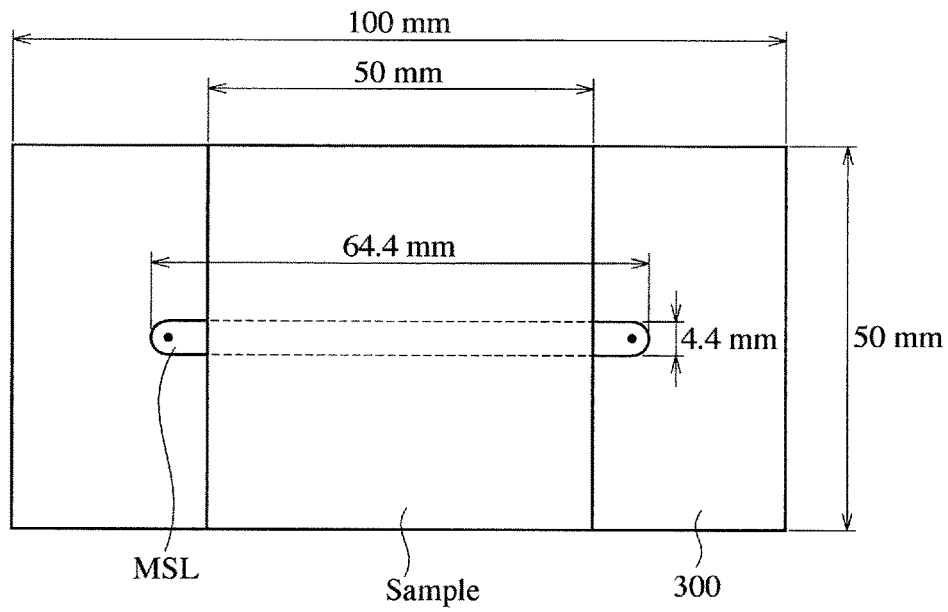
FIG. 6(a) is a plan view showing a system for measuring reflected wave power and transmitted wave power to incident wave.
Figure 6B:
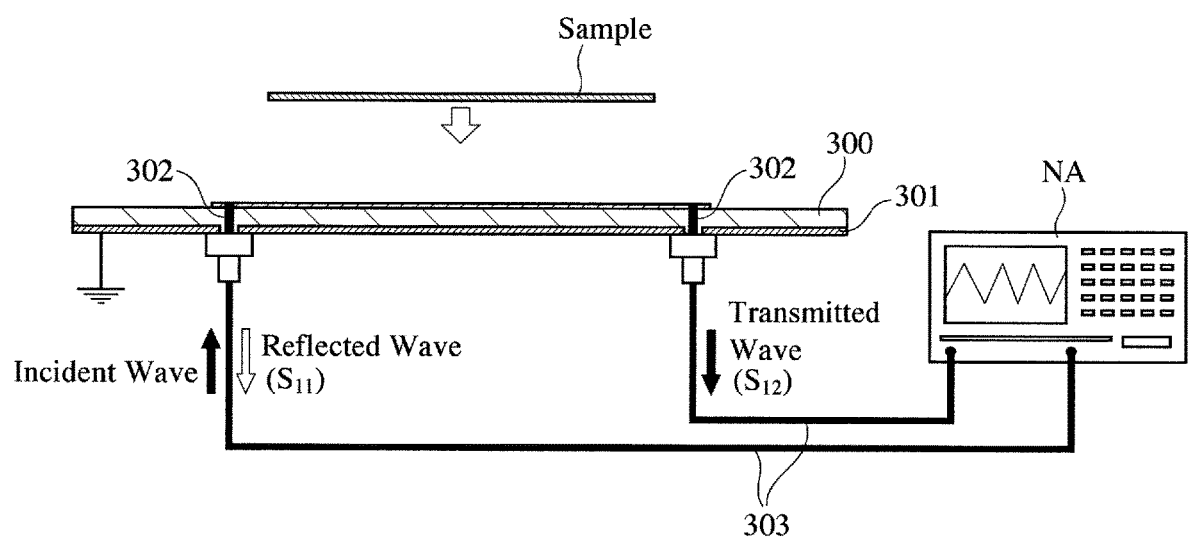
FIG. 6(b) is a schematic, partial cross-sectional view showing the system of FIG. 6(a).
Figure 7:
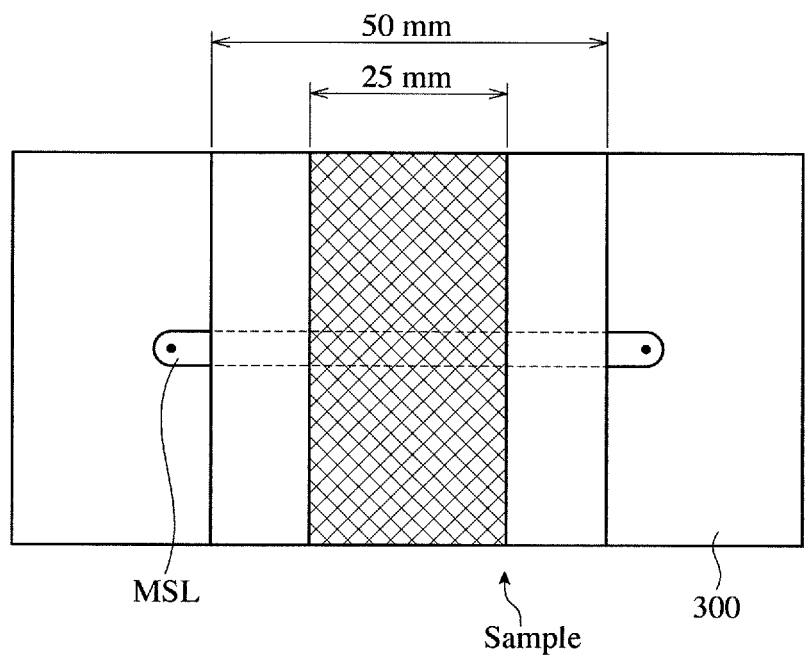
FIG. 7 is a plan view showing an example of samples placed on a microstripline MSL.
Figure 8:
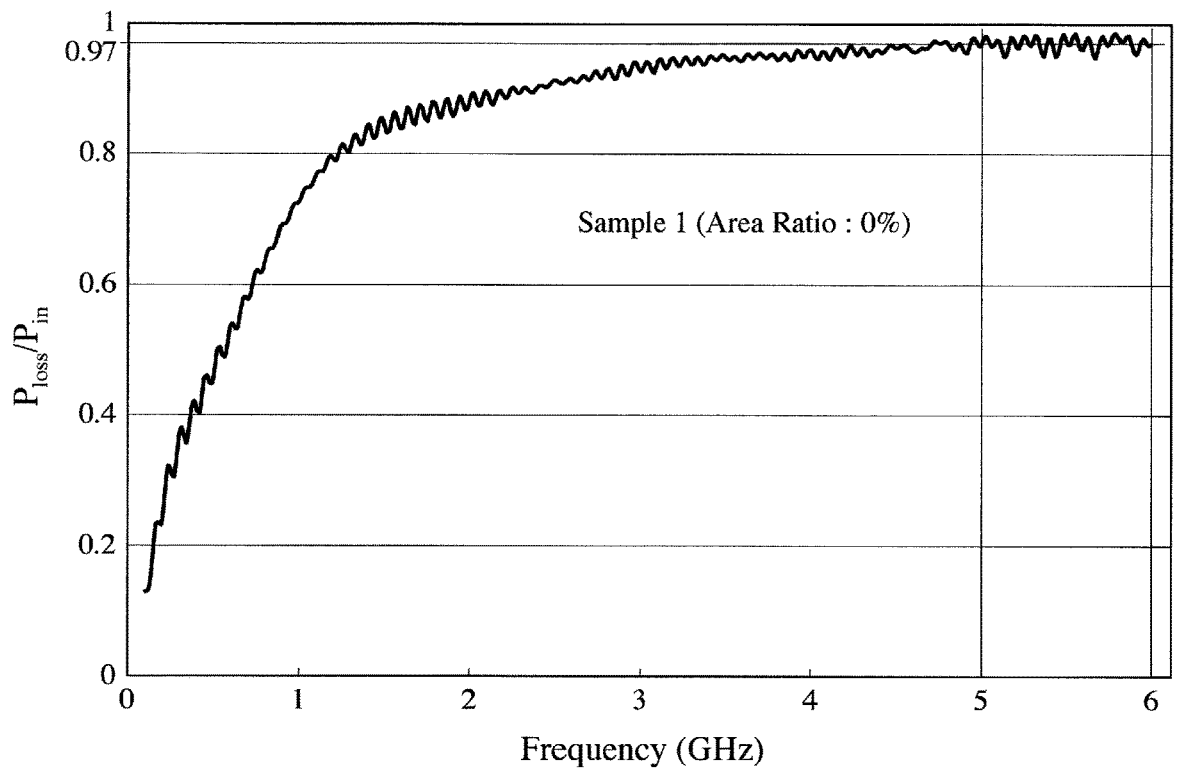
FIG. 8 is a graph showing the noise absorption ratio $P_{loss}/P_{in}$ of Sample 1 (area ratio of aluminum foil piece=0%) of the electromagnetic-wave-absorbing composite sheet.
Figure 9:
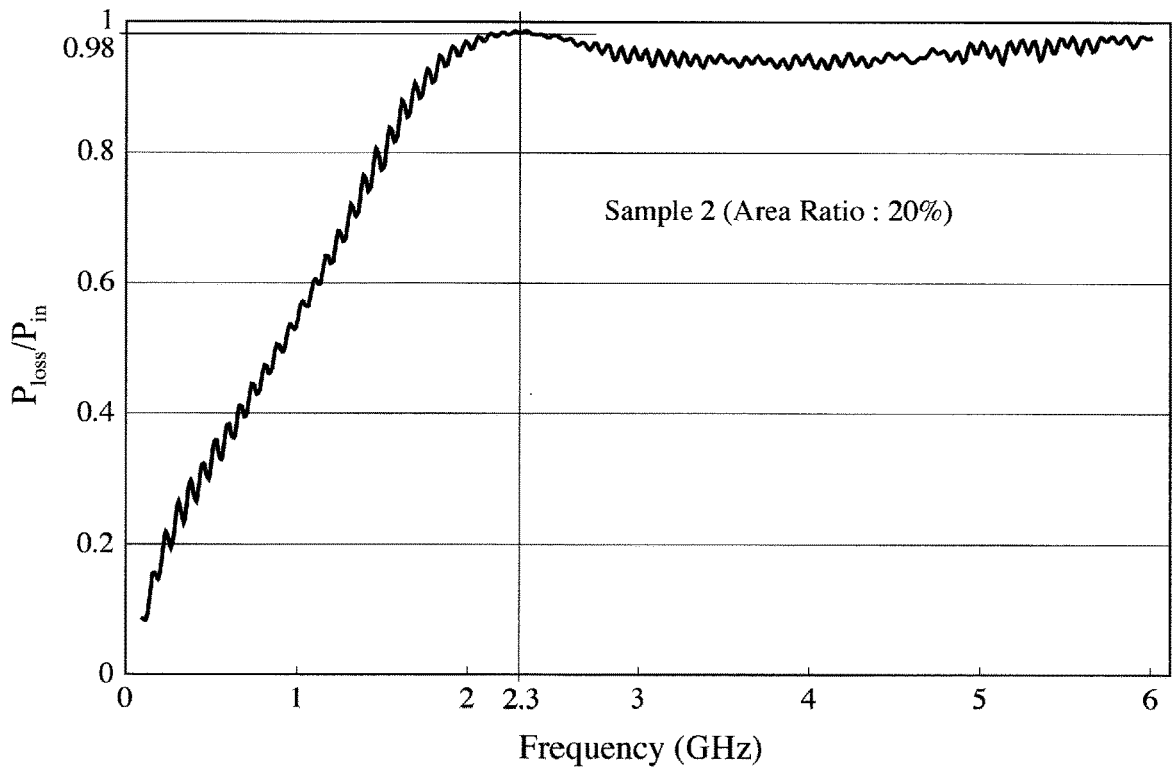
FIG. 9 is a graph showing the noise absorption ratio $P_{loss}/P_{in}$ of Sample 2 (area ratio of aluminum foil piece=20%) of the electromagnetic-wave-absorbing composite sheet.
Figure 10:
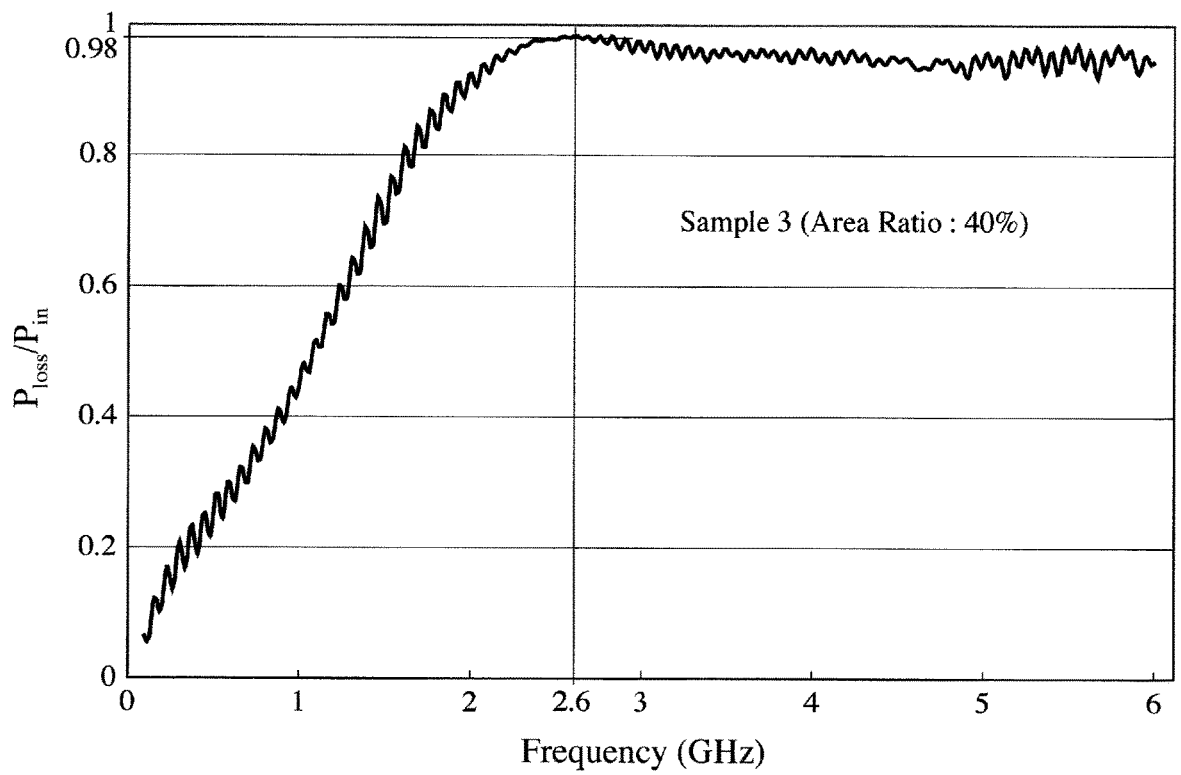
FIG. 10 is a graph showing the noise absorption ratio $P_{loss}/P_{in}$ of Sample 3 (area ratio of aluminum foil piece=40%) of the electromagnetic-wave-absorbing composite sheet.
Figure 11:
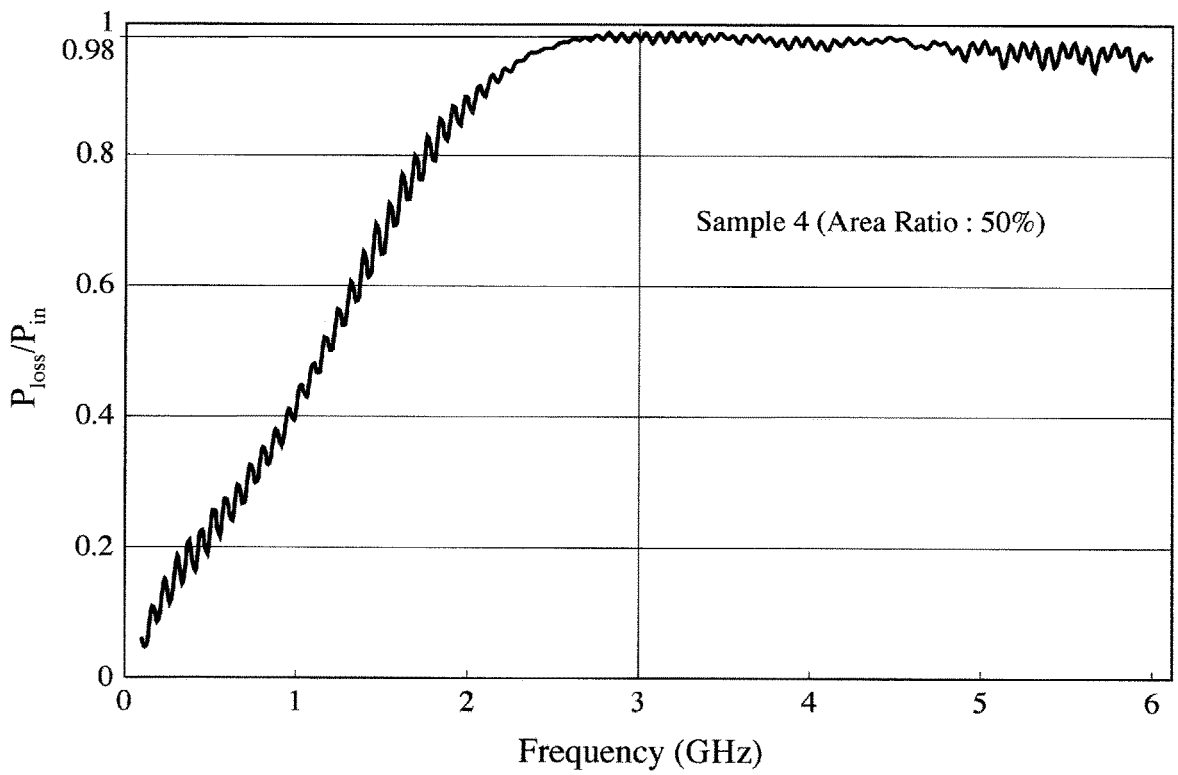
FIG. 11 is a graph showing the noise absorption ratio $P_{loss}/P_{in}$ of Sample 4 (area ratio of aluminum foil piece=50%) of the electromagnetic-wave-absorbing composite sheet.
Figure 12:
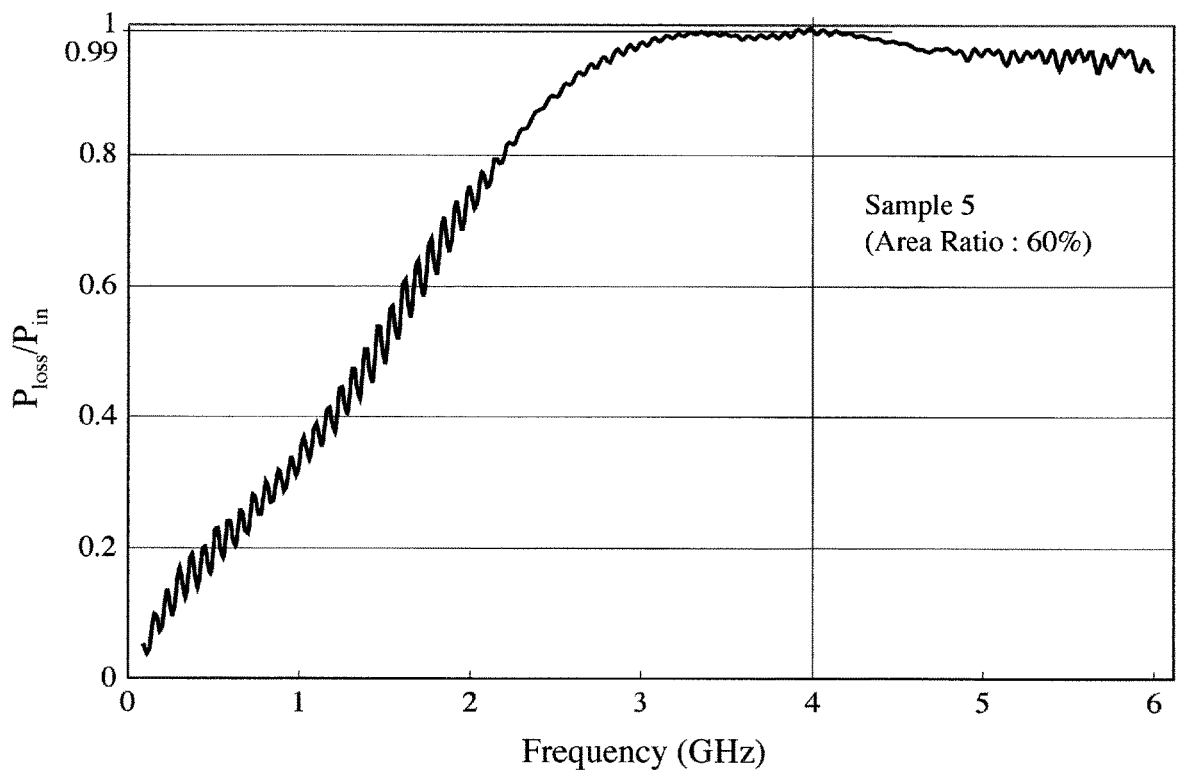
FIG. 12 is a graph showing the noise absorption ratio $P_{loss}/P_{in}$ of Sample 5 (area ratio of aluminum foil piece=60%) of the electromagnetic-wave-absorbing composite sheet.
Figure 13:
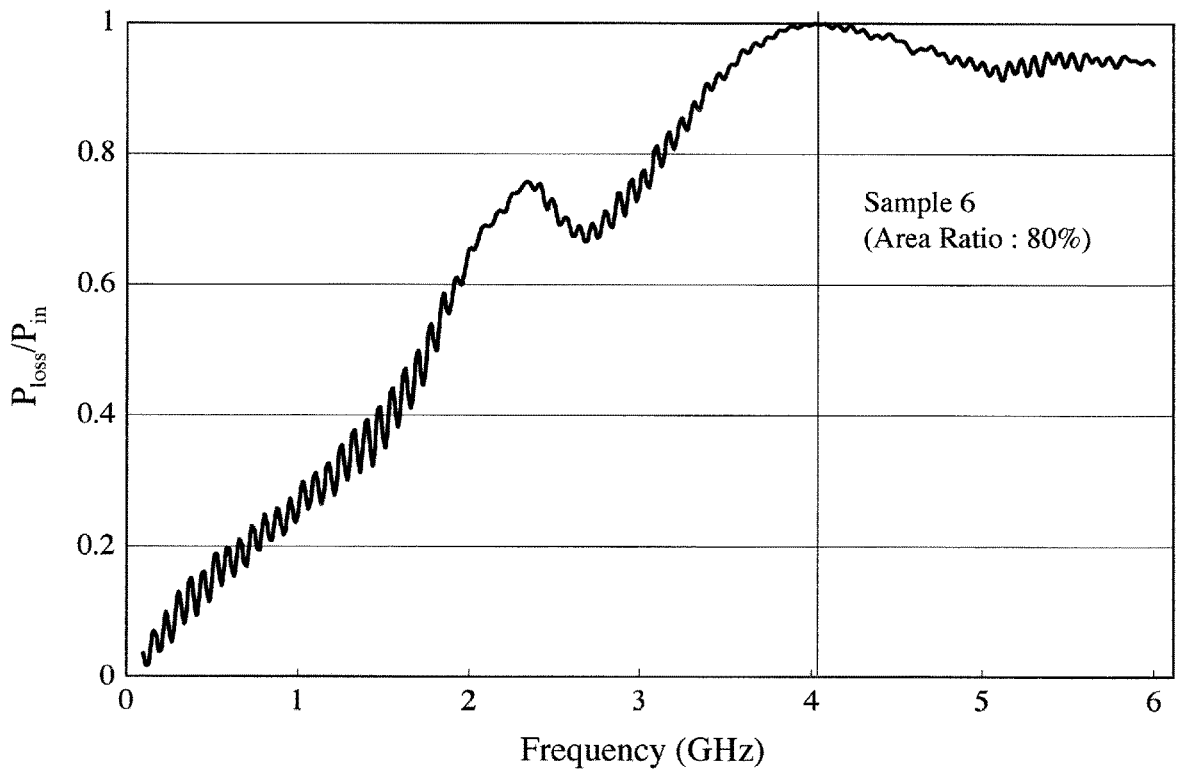
FIG. 13 is a graph showing the noise absorption ratio $P_{loss}/P_{in}$ of Sample 6 (area ratio of aluminum foil piece=80%) of the electromagnetic-wave-absorbing composite sheet.
Figure 14:
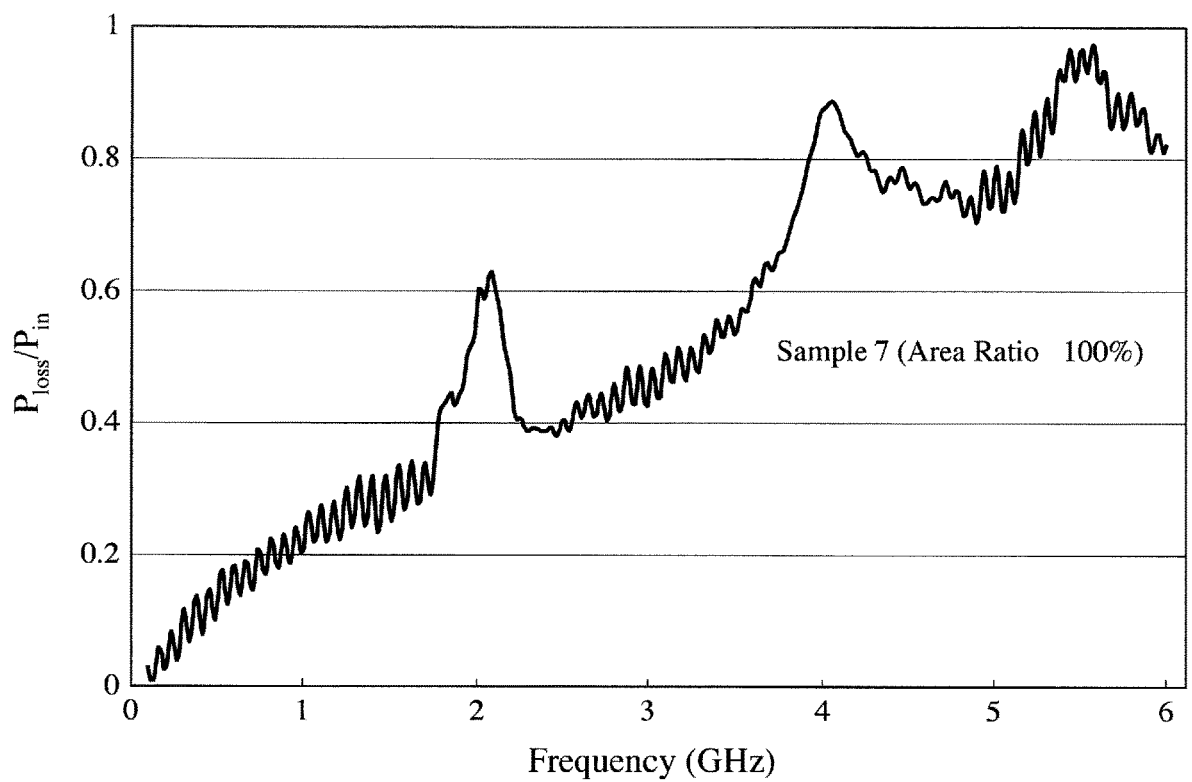
FIG. 14 is a graph showing the noise absorption ratio $P_{loss}/P_{in}$ of Sample 7 (area ratio of aluminum foil piece=100%) of the electromagnetic-wave-absorbing composite sheet.

Using a system comprising a microstripline MSL (64.4 mm×4.4 mm) of 50Ω, an insulation substrate 300 supporting the microstripline MSL, a grounded electrode 301 attached to a lower surface of the insulation substrate 300, conductor pins 302, 302 connected to both ends of the microstripline MSL, a network analyzer NA, and coaxial cables 303, 303 connecting the network analyzer NA to the conductor pins 302, 302 as shown in FIGS. 6(a) and 6(b), each sample was attached to an upper surface of the insulation substrate 300 by an adhesive such that a center of each sample was aligned with a center of the microstripline MSL as shown in FIG. 7, to measure reflected wave power $S_{11}$ and transmitted wave power $S_{12}$ to incident waves of 0.1-6 GHz.

Power loss $P_{loss}$ was determined by subtracting the reflected wave power $S_{11}$ and the transmitted wave power $S_{12}$ from the incident power $P_{in}$ input to the system shown in FIGS. 6(a) and 6(b), and a noise absorption ratio $P_{loss}/P_{in}$ was determined by dividing $P_{loss}$ by the incident power $P_{in}$. The results are shown in FIGS. 8 to 14 and Table 1.

TABLE 1

| Sample No. | Aluminum Foil Piece | | Maximum Noise Absorption | |
|---|---|---|---|---|
| | L (mm) | Area Ratio[1] (%) | $P_{loss}/P_{in}$ | Frequency (GHz) |
| 1* | 0 | 0 | 0.97 | 5-6[2] |
| 2 | 10 | 20 | 0.98 | 2.3 |
| 3 | 20 | 40 | 0.98 | 2.6 |
| 4 | 25 | 50 | 0.98 | 3 |
| 5 | 30 | 60 | 0.99 | 4 |
| 6 | 40 | 80 | 1.00 | 4 |
| 7* | 50 | 100 | — | — |

Note:
[1]An area ratio of the aluminum foil piece to the electromagnetic-wave-absorbing film piece.
[2]No peak in $P_{loss}/P_{in}$.
Samples with * are Comparative Examples.

In Sample 1 having no aluminum foil piece laminated on the electromagnetic-wave-absorbing film piece, the maximum noise absorption ratio $P_{loss}/P_{in}$ was as high as 0.97, but a frequency at that ratio was 5-6 GHz, and $P_{loss}/P_{in}$ was flat with no peak. In Sample 7 having an aluminum foil piece of the same size laminated on the electromagnetic-wave-absorbing film piece, the maximum noise absorption ratio $P_{loss}/P_{in}$ was low as a whole. On the other hand, in Samples 2-6 having aluminum foil pieces with area ratios of 20-80% laminated on electromagnetic-wave-absorbing film pieces, the maximum noise absorption ratios $P_{loss}/P_{in}$ were as high as 0.98-1.00, and frequencies at them were in a range of 2-4 GHz (around 3 GHz). It is thus clear that to maximize the noise absorption ratio $P_{loss}/P_{in}$ in a frequency range of 2-4 GHz, the area ratio of the aluminum foil piece (electromagnetic-wave-shielding film) to the electromagnetic-wave-absorbing film piece should be in a range of 10-80%, and is preferably in a range of 20-80%.

Example 2

An aluminum foil piece (thickness: 15 μm) of 25 mm×50 mm was laminated via a non-conductive adhesive on each electromagnetic-wave-absorbing film piece of 50 mm×50 mm having a thin Ni film used in Example 1, such that the distance D between one side $X_1$ of the electromagnetic-wave-absorbing film piece and one side $X_2$ (parallel to $X_1$) of the aluminum foil piece was 0 mm, 5 mm, 10 mm, 15 mm, 20 mm, and 25 mm, respectively, as shown in FIG. 5(a), to produce Samples 11-16. Each sample was placed on the microstripline MSL on the insulation substrate 300 as shown in FIG. 6(a), to measure its noise absorption ratio $P_{loss}/P_{in}$ in a range of 0.1-6 GHz. With respect to each sample, the distance D, the noise absorption ratio $P_{loss}/P_{in}$ at 2 GHz, the maximum noise absorption ratio $P_{loss}/P_{in}$, and a frequency at the maximum noise absorption ratio are shown in Table 2.

TABLE 2

| Sample No. | $D^{(1)}$ (mm) | $P_{loss}/P_{in}$ at 2 GHz | Maximum $P_{loss}/P_{in}$ (GHz) |
| --- | --- | --- | --- |
| 11 | 0 | 0.46 | 0.98 (3.9) |
| 12 | 5 | 0.52 | 0.99 (3.7) |
| 13 | 10 | 0.80 | 0.98 (3.1) |
| 14 | 15 | 0.90 | 0.97 (2.6-4.6) |
| 15 | 20 | 0.92 | 0.96 (2.3-4.3) |
| 16 | 25 | 0.95 | 0.97 (3.5-4.0) |

Note:
$^{(1)}$D represents the distance between one side $X_1$ of the electromagnetic-wave-absorbing film piece and one side $X_2$ of the aluminum foil piece.

As is clear from Table 2, as the aluminum foil piece was shifted relative to the electromagnetic-wave-absorbing film piece having a thin Ni film, the $P_{loss}/P_{in}$ at 2 GHz and the maximum $P_{loss}/P_{in}$ changed drastically. This indicates that to maximize the noise absorption ratio $P_{loss}/P_{in}$ in a desired frequency range, a center of the aluminum foil piece need only be deviated from a center of the electromagnetic-wave-absorbing film piece.

Example 3

Figure 15:
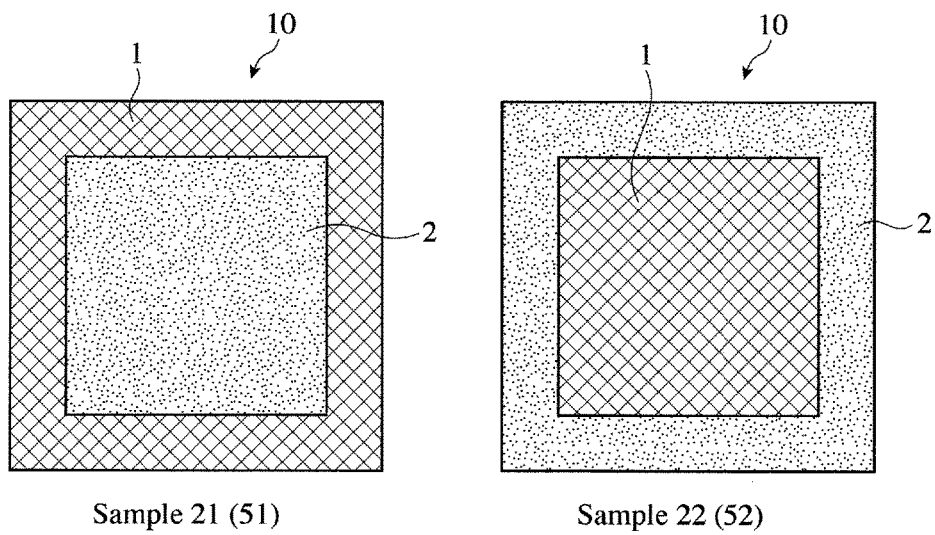
FIG. 15 is a plan view showing Samples 21 and 22 (51 and 52) of the electromagnetic-wave-absorbing composite sheet.

As shown in FIG. 15, a square aluminum foil piece having an area ratio of 50%, and a square-frame-shaped aluminum foil piece having an area ratio of 50% were laminated on each electromagnetic-wave-absorbing film piece having a thin Ni film, which had a size of 50 mm×50 mm as in Example 1, such that their centers were aligned, to produce Samples 21 and 22. The noise absorption ratio $P_{loss}/P_{in}$ of each sample was measured. The measurement results are shown in FIGS. 16(a) and 16(b).

Figure 16A:
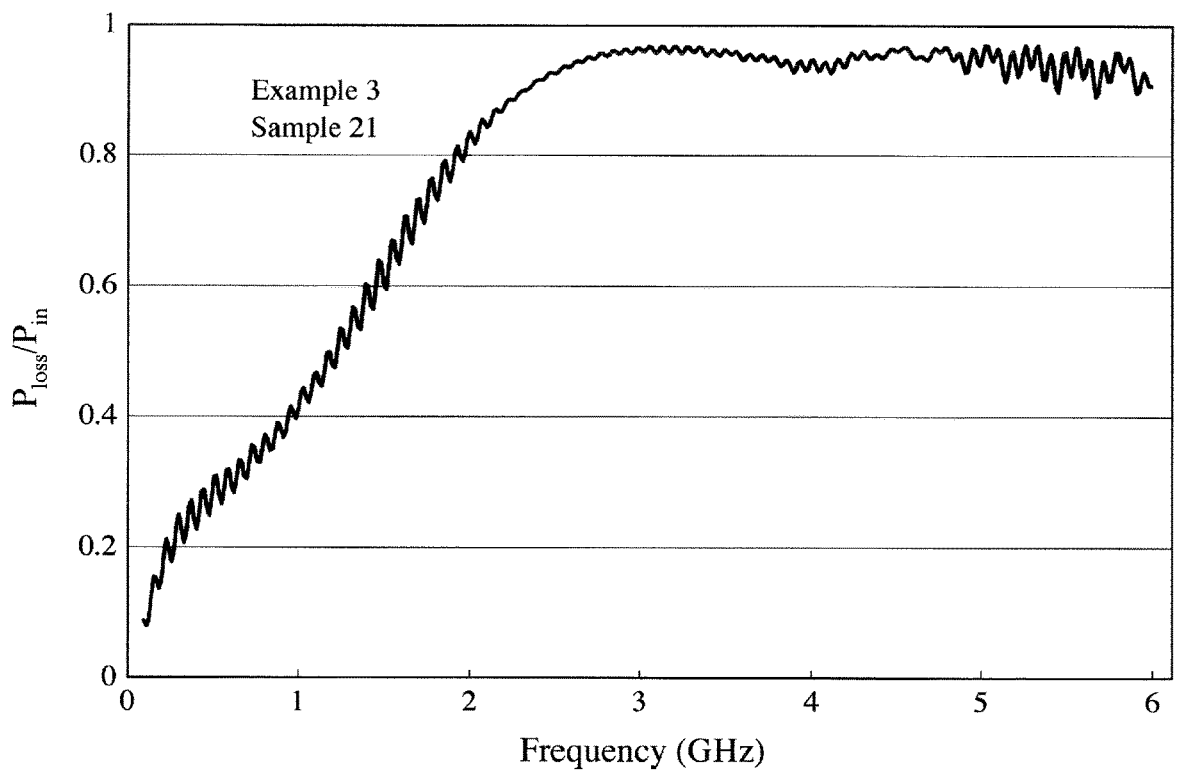
FIG. 16(a) is a graph showing the noise absorption ratio $P_{loss}/P_{in}$ of Sample 21 of the electromagnetic-wave-absorbing composite sheet comprising a square aluminum foil piece laminated on a center portion of an electromagnetic-wave-absorbing film piece having a thin Ni film.
Figure 16B:
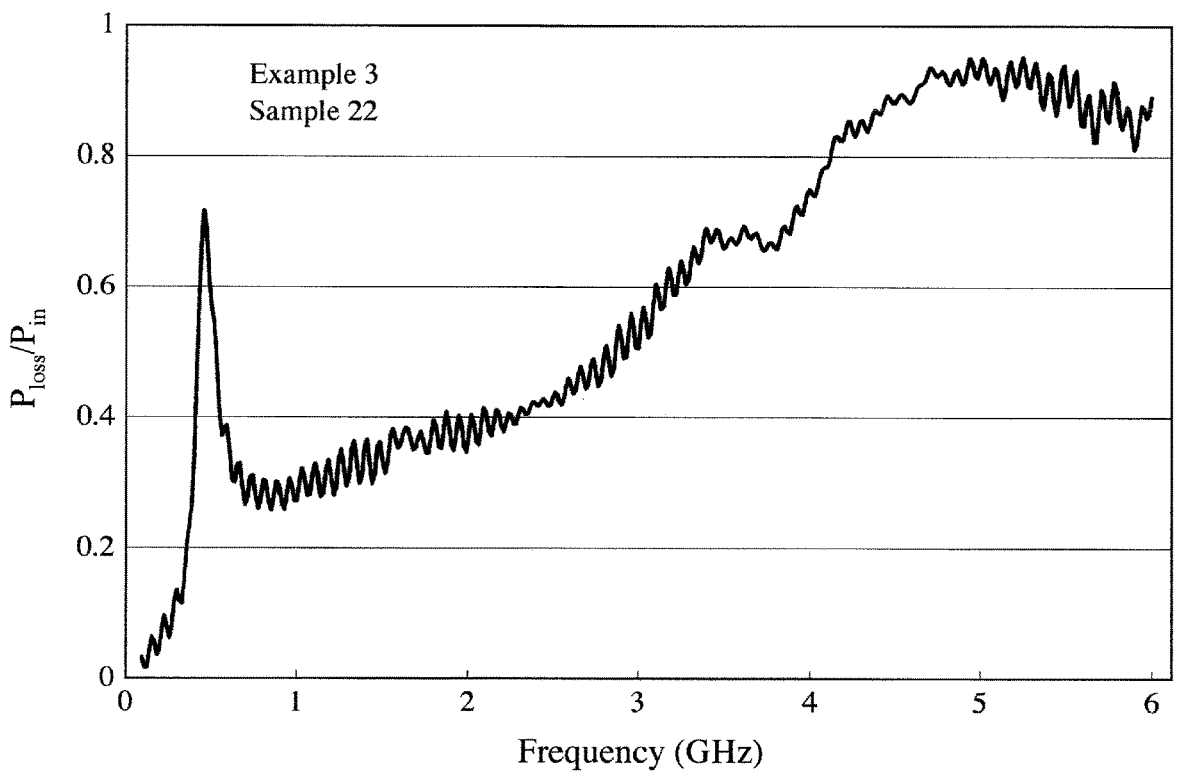
FIG. 16(b) is a graph showing the noise absorption ratio $P_{loss}/P_{in}$ of Sample 22 of the electromagnetic-wave-absorbing composite sheet comprising a square-frame-shaped aluminum foil piece laminated on an electromagnetic-wave-absorbing film piece having a thin Ni film.

As is clear from FIGS. 16(a) and 16(b), Sample 21 laminated with a square aluminum foil piece having an area ratio of 50% exhibited an extremely higher noise absorption ratio $P_{loss}/P_{in}$ than that of Sample 22 laminated with the square-frame-shaped aluminum foil piece, despite the same area ratio. This indicates that the aluminum foil piece is preferably positioned in a center portion of the electromagnetic-wave-absorbing film piece.

Example 4

A square electromagnetic-wave-absorbing composite sheet as large as an IC chip in Fire Stick TV of Amazon, which had the same structure as in Example 1, was produced. A rectangular aluminum foil piece had an area ratio of 50% to the electromagnetic-wave-absorbing film piece. One pair of opposing sides of the aluminum foil piece were aligned with one pair of opposing sides of the electromagnetic-wave-absorbing film piece, and a center of the laminated aluminum foil piece was aligned with a center of the electromagnetic-wave-absorbing film piece. Namely, the electromagnetic-wave-absorbing composite sheet of Example 4 had the shape shown in FIG. 1(b).

Figure 17A:
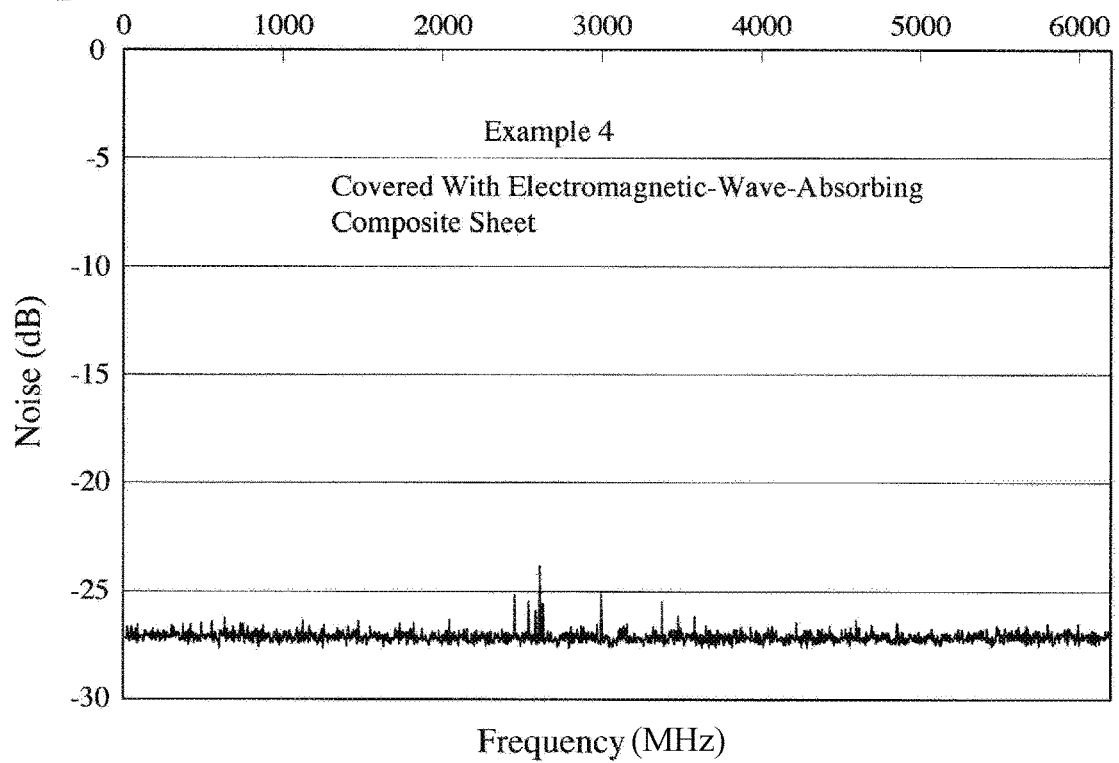
FIG. 17(a) is a graph showing electromagnetic wave noise at a frequency near 3 GHz leaking from Fire Stick TV, when an IC chip in the Fire Stick TV was covered with the electromagnetic-wave-absorbing composite sheet of Example 4.
Figure 17B:
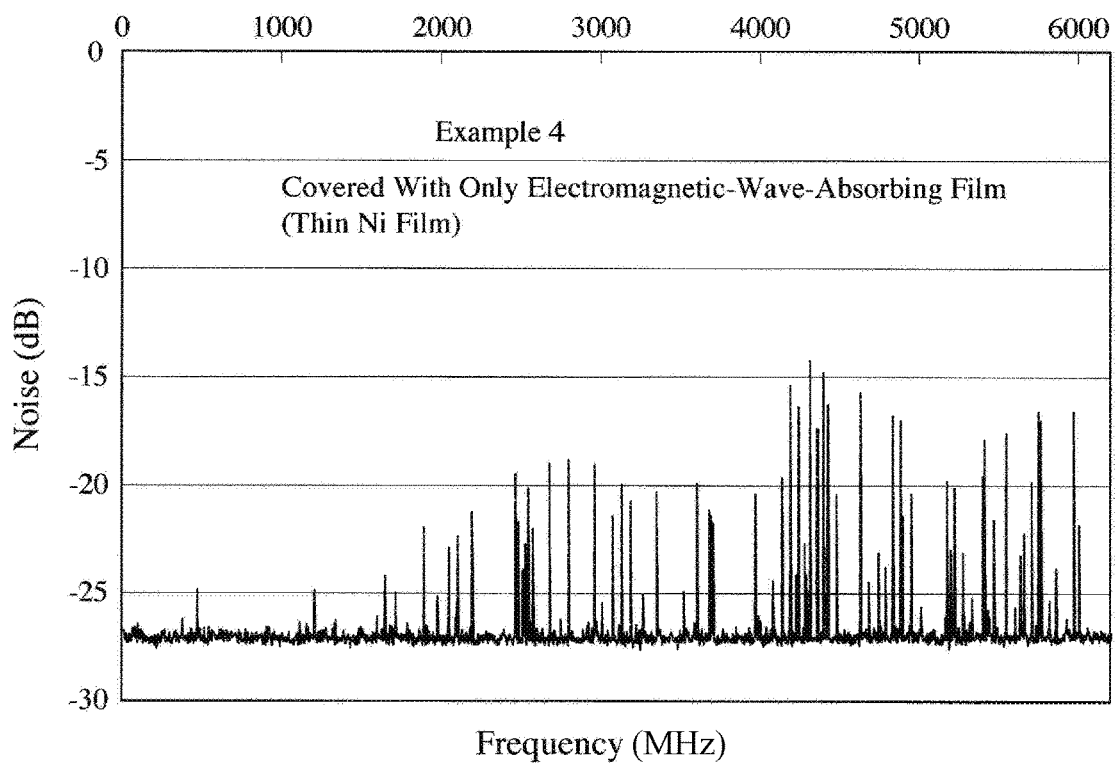
FIG. 17(b) is a graph showing electromagnetic wave noise at a frequency near 3 GHz leaking from Fire Stick TV, when an IC chip in the Fire Stick TV was covered with only the same electromagnetic-wave-absorbing film having a thin Ni film as in Example 1.
Figure 17C:
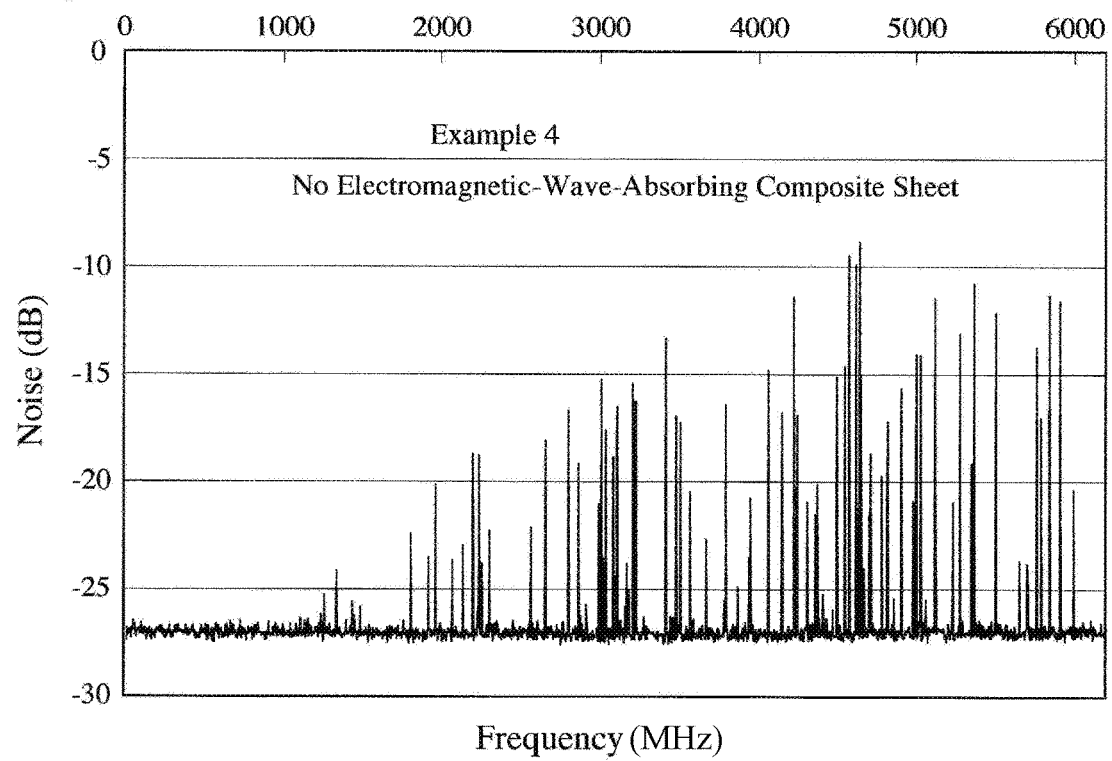
FIG. 17(c) is a graph showing electromagnetic wave noise at a frequency near 3 GHz leaking from Fire Stick TV, when an IC chip in the Fire Stick TV was not covered with the electromagnetic-wave-absorbing composite sheet of Example 4.

With a cover removed from the Fire Stick TV, the electromagnetic-wave-absorbing composite sheet of Example 4 was placed on the IC chip in the Fire Stick TV, to measure electromagnetic wave noise leaking from the Fire Stick TV by a spectrum analyzer VSA6G2A available from Keisoku Giken Co., Ltd. The results are shown in FIG. 17(a). Also, electromagnetic wave noise leaking from the Fire Stick TV was measured, when only the same electromagnetic-wave-absorbing film having a thin Ni film as in Example 1 was placed on the IC chip in the Fire Stick TV with a cover removed, and when the electromagnetic-wave-absorbing composite sheet of Example 4 was not placed. The results are shown in FIGS. 17(b) and 17(c). As is clear from FIGS. 17(a) to 17(c), electromagnetic wave noise at a frequency of around 3 GHz leaking from the Fire Stick TV remarkably decreased when the electromagnetic-wave-absorbing composite sheet of the present invention was placed on the IC chip, than when only the electromagnetic-wave-absorbing film having a thin Ni film was placed, and when no electromagnetic-wave-absorbing composite sheet was placed.

Example 5

Figure 18:
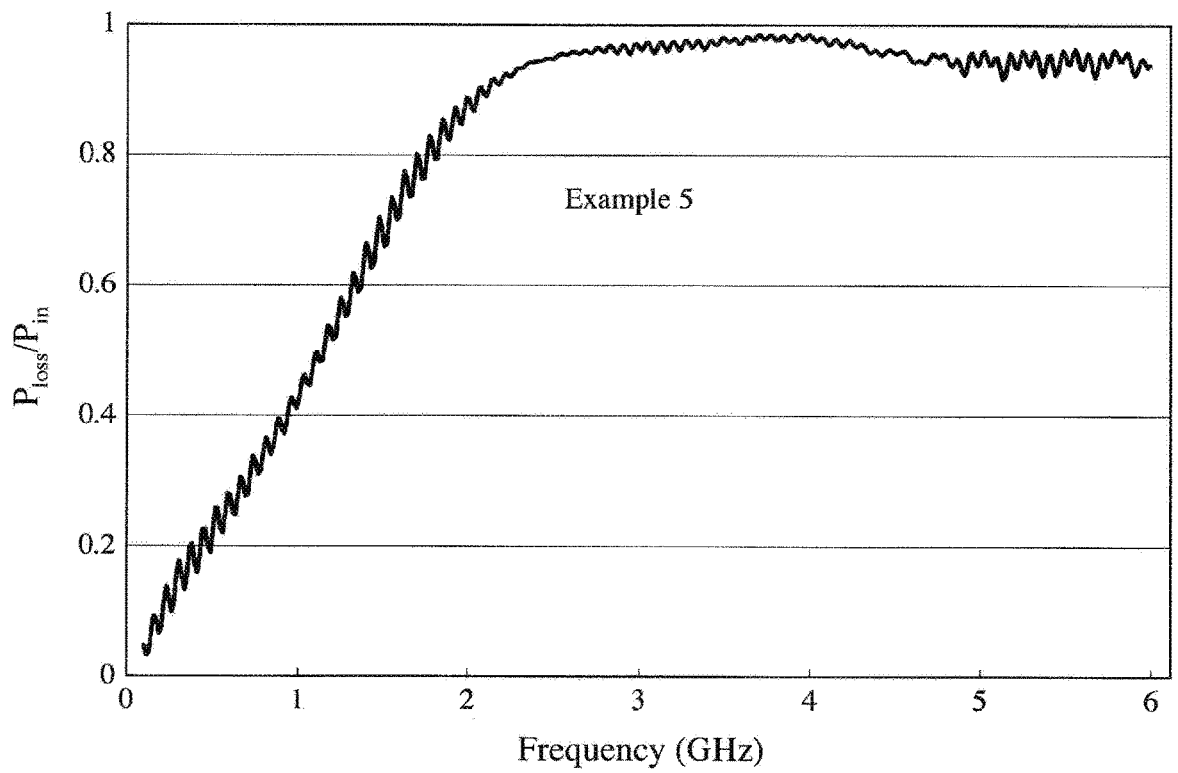
FIG. 18 is a graph showing the noise absorption ratio $P_{loss}/P_{in}$ of the electromagnetic-wave-absorbing composite sheet of Example 5 comprising a carbon sheet piece of graphite powder/carbon black as an electromagnetic-wave-shielding film.
Figure 19:
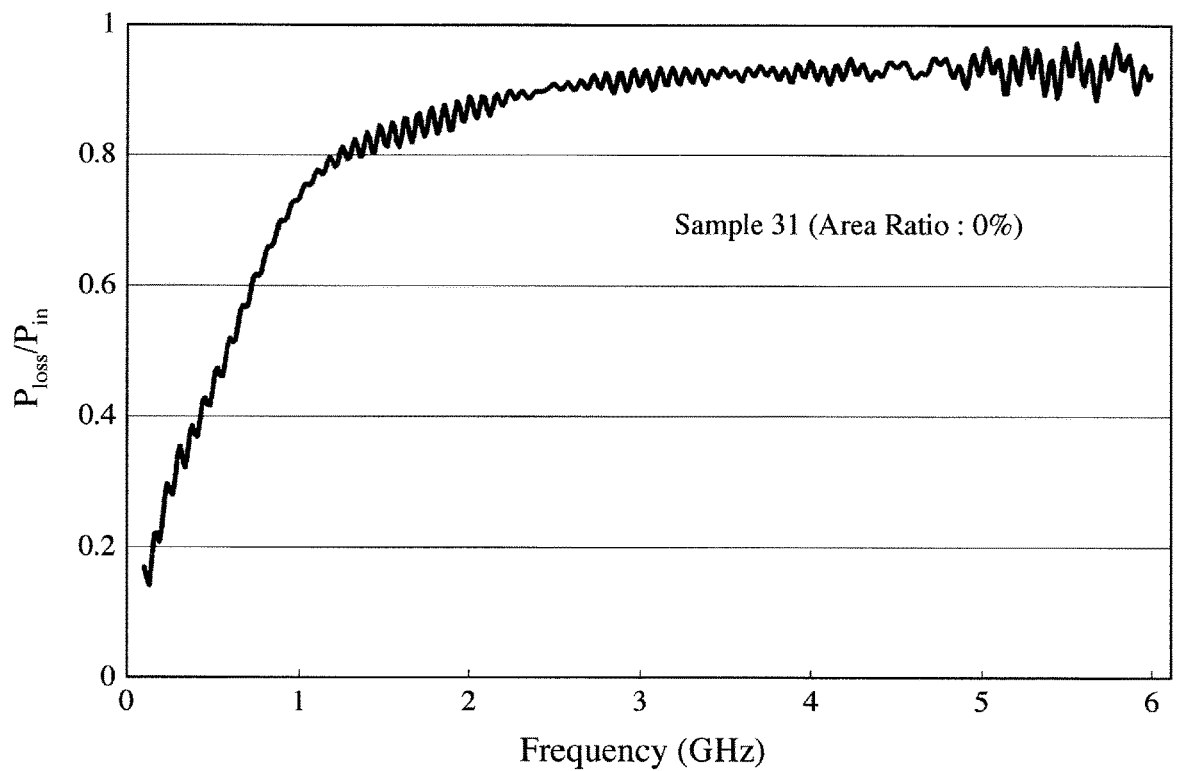
FIG. 19 is a graph showing the noise absorption ratio $P_{loss}/P_{in}$ of Sample 31 (area ratio of aluminum foil piece=0%) of the electromagnetic-wave-absorbing composite sheet.
Figure 20:
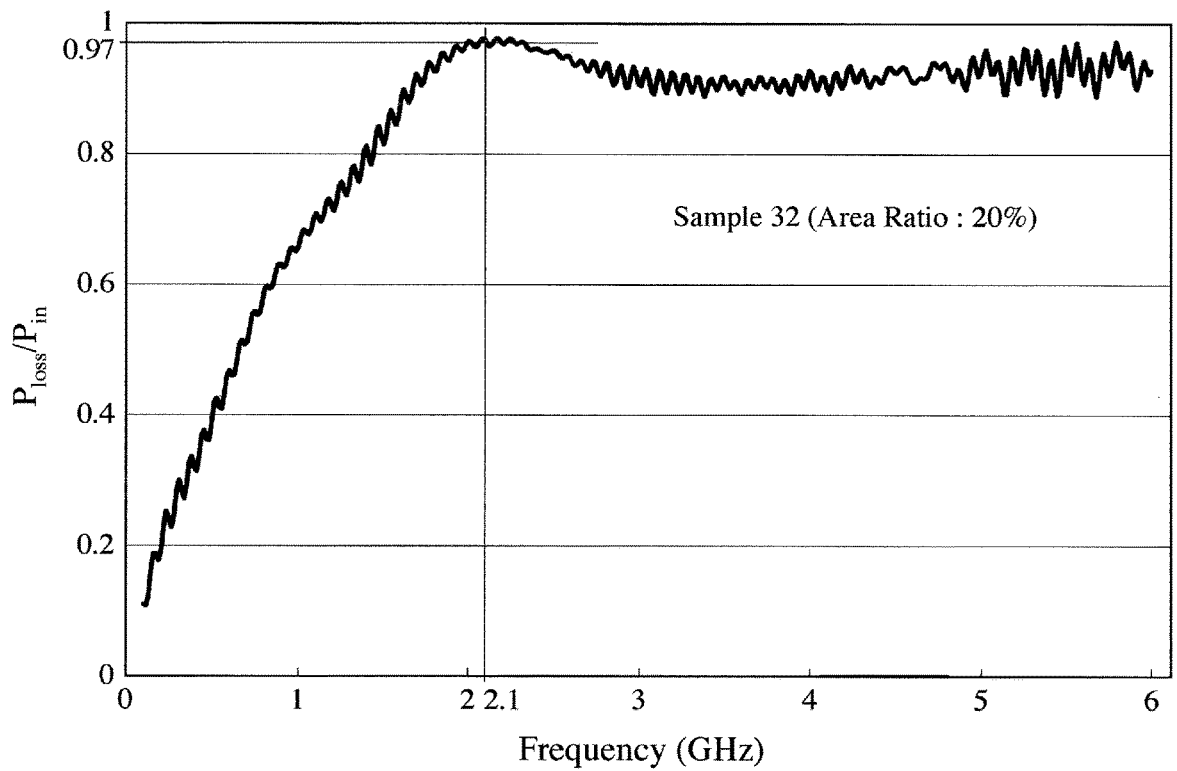
FIG. 20 is a graph showing the noise absorption ratio $P_{loss}/P_{in}$ of Sample 32 (area ratio of aluminum foil piece=20%) of the electromagnetic-wave-absorbing composite sheet.
Figure 21:
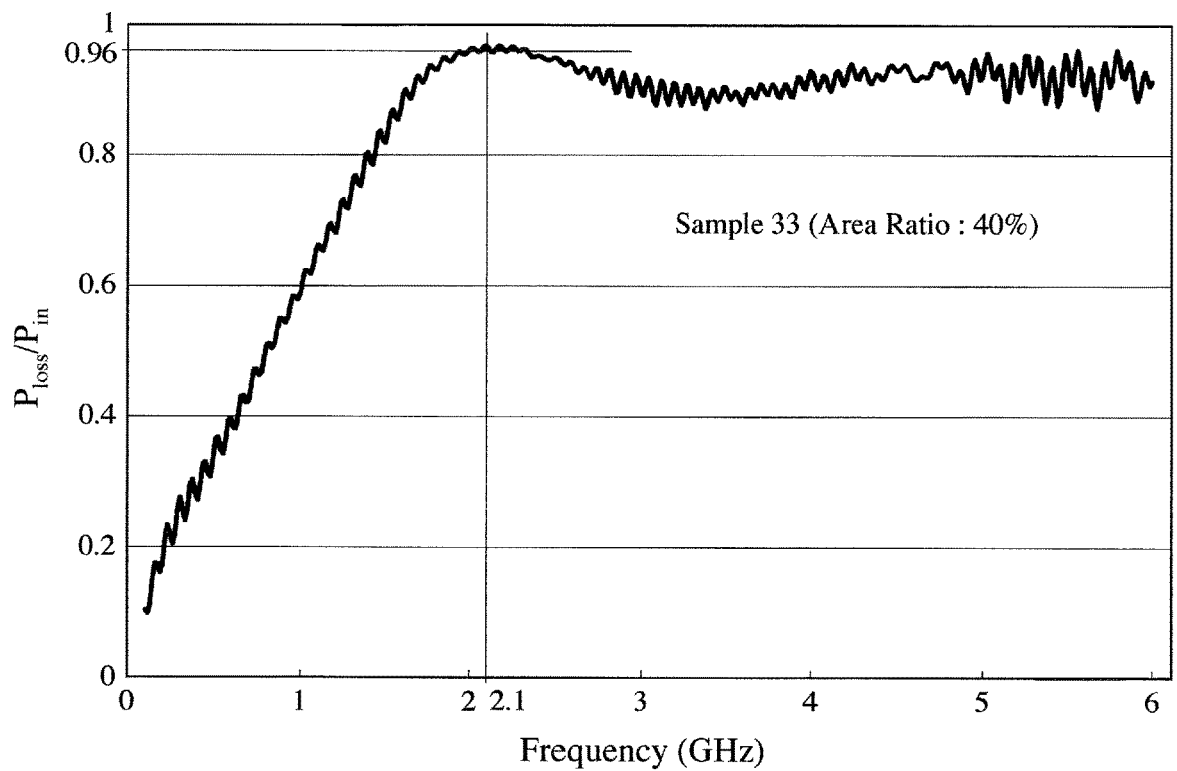
FIG. 21 is a graph showing the noise absorption ratio $P_{loss}/P_{in}$ of Sample 33 (area ratio of aluminum foil piece=40%) of the electromagnetic-wave-absorbing composite sheet.
Figure 22:
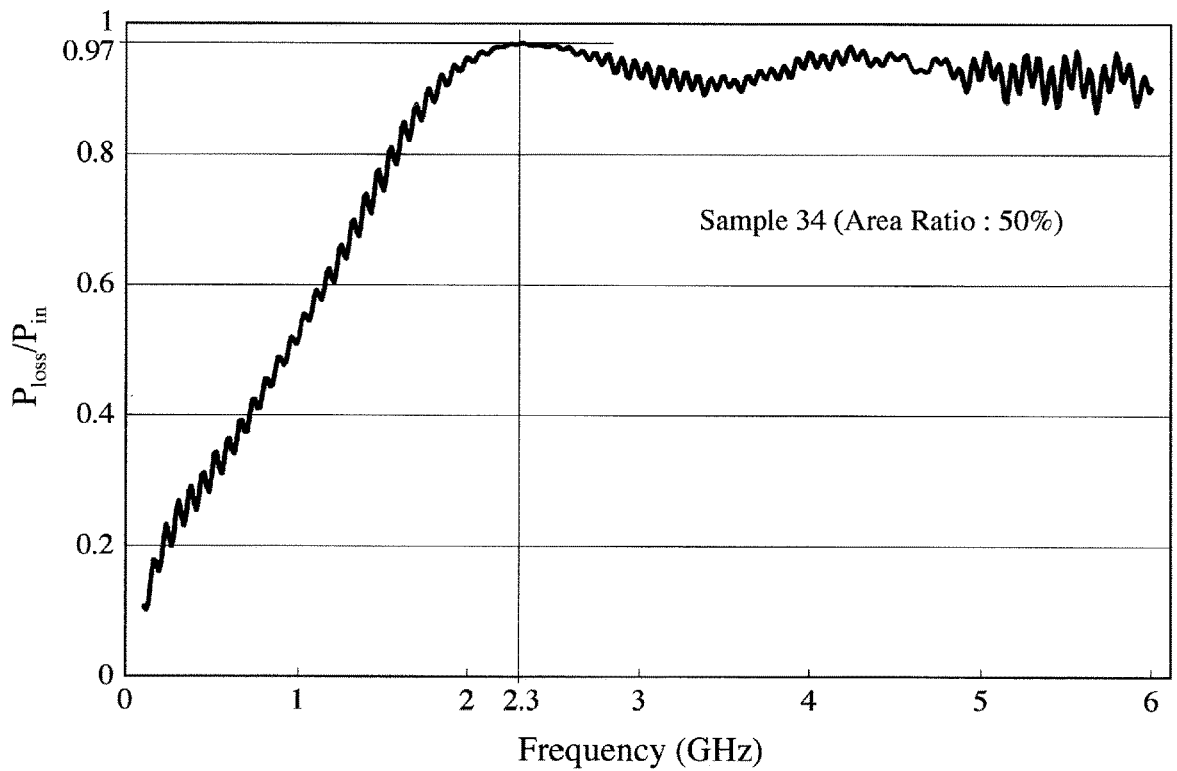
FIG. 22 is a graph showing the noise absorption ratio $P_{loss}/P_{in}$ of Sample 34 (area ratio of aluminum foil piece=50%) of the electromagnetic-wave-absorbing composite sheet.
Figure 23:
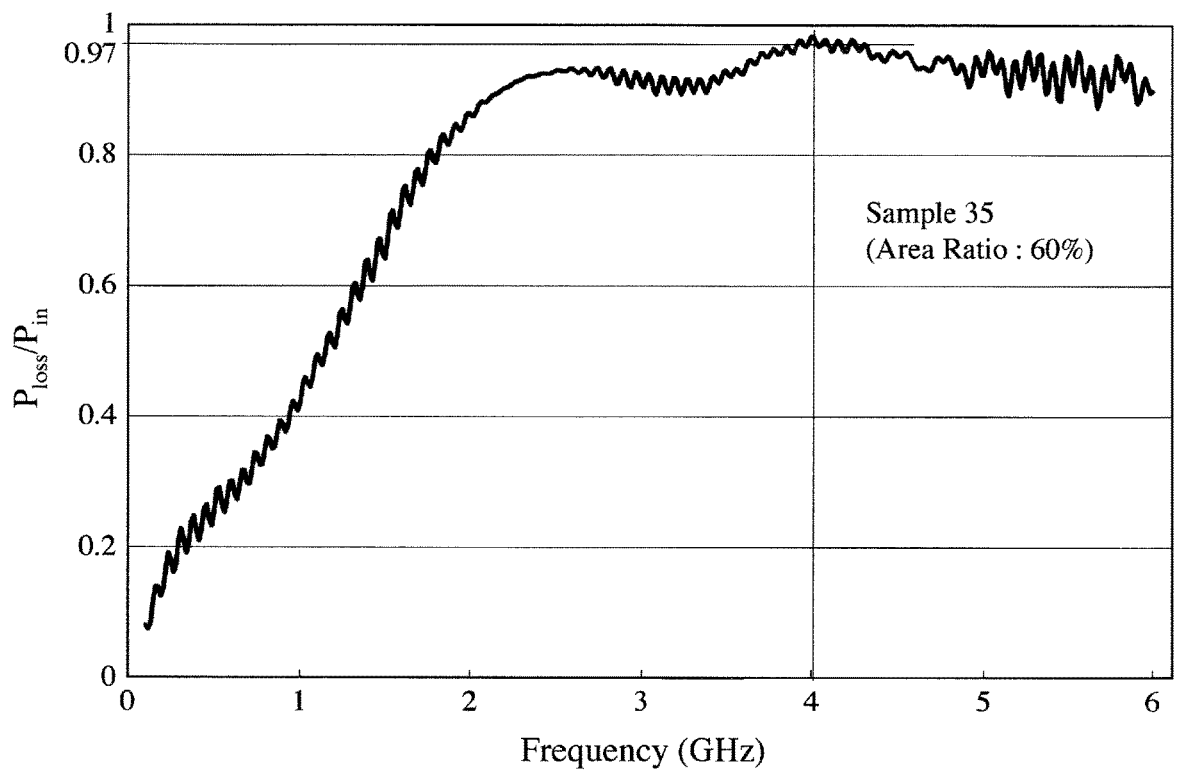
FIG. 23 is a graph showing the noise absorption ratio $P_{loss}/P_{in}$ of Sample 35 (area ratio of aluminum foil piece=60%) of the electromagnetic-wave-absorbing composite sheet.
Figure 24:
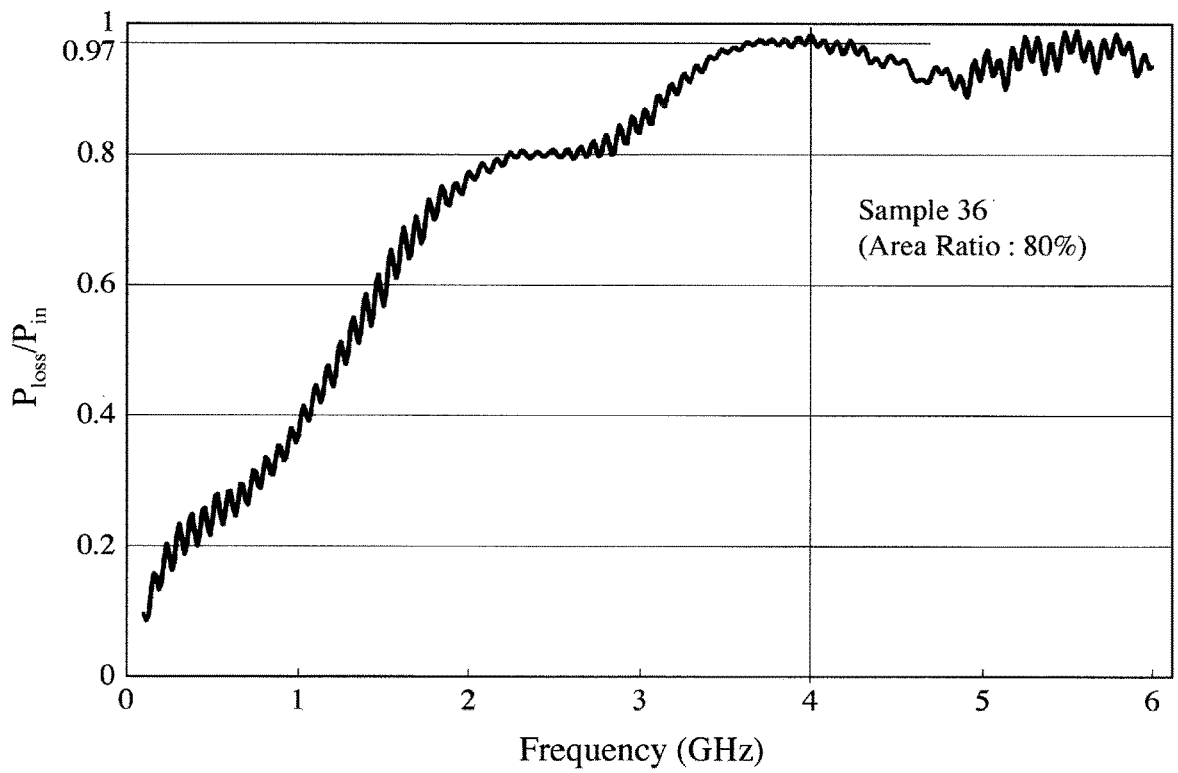
FIG. 24 is a graph showing the noise absorption ratio $P_{loss}/P_{in}$ of Sample 36 (area ratio of aluminum foil piece=80%) of the electromagnetic-wave-absorbing composite sheet.
Figure 25:
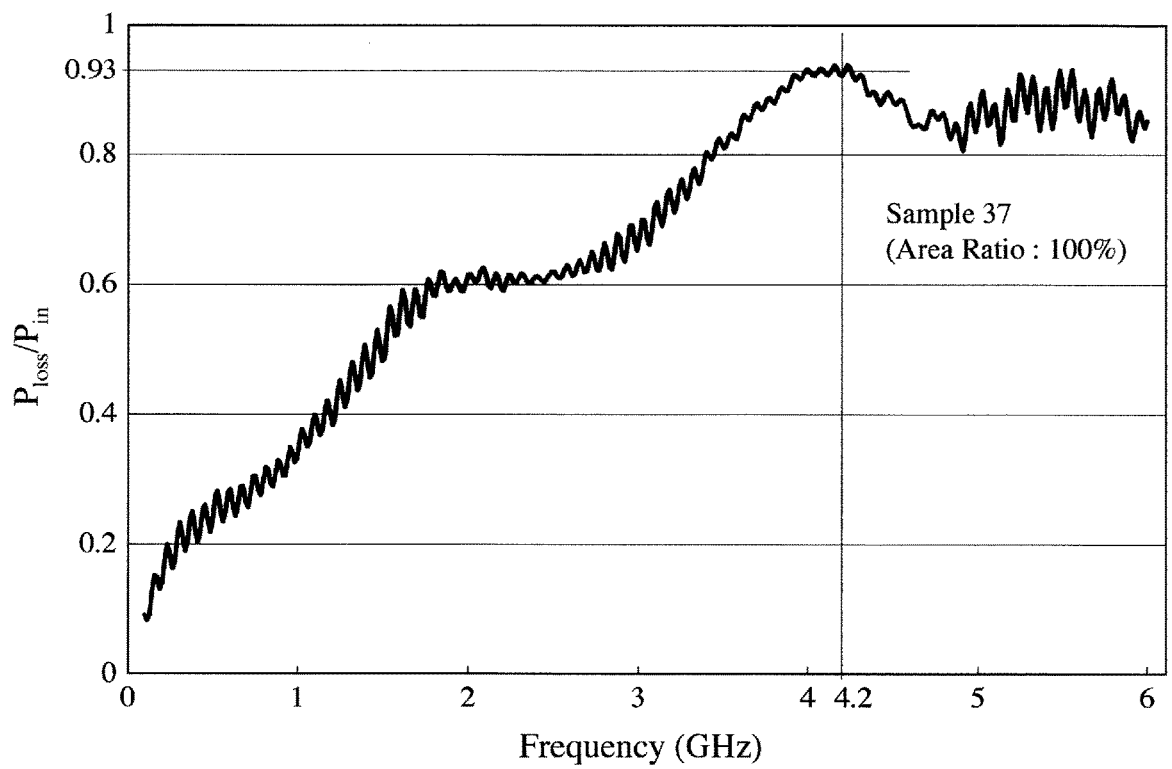
FIG. 25 is a graph showing the noise absorption ratio $P_{loss}/P_{in}$ of Sample 37 (area ratio of aluminum foil piece=100%) of the electromagnetic-wave-absorbing composite sheet.

An electromagnetic-wave-absorbing composite sheet was produced in the same manner as in Example 1, except for laminating a carbon sheet piece of graphite powder/carbon black having a size of 25 mm×50 mm in place of the aluminum foil piece on the electromagnetic-wave-absorbing film piece of 50 mm×50 mm with their centers aligned. The carbon sheet of graphite powder/carbon black was produced by the same method as in Example 1 of JP 2015-170660 A. The noise absorption ratio $P_{loss}/P_{in}$ of the electromagnetic-wave-absorbing composite sheet was measured in the same manner as in Example 1. The results are shown in FIG. 18. As is clear from FIG. 18, the same results as in Example 1 were obtained, even when the carbon sheet piece was used in place of the aluminum foil piece.

Example 6

Five test pieces TP of 10 cm×10 cm were cut out of PCF-005 available from Takeuchi Industry CO., LTD. as an electromagnetic-wave-absorbing film having a thin conductive polymer film. The surface resistance of each test piece TP was measured by a pressurized two-terminal method in the same manner as in Example 1. As a result, the average surface resistance of all test pieces TP was 110 Ω/square. Electromagnetic-wave-absorbing film pieces 1 of 50 mm×50 mm were cut out of the PCF-005 film, and an aluminum foil piece (thickness: 15 μm) 2 having a size of L (0 mm, 10 mm, 20 mm, 25 mm, 30 mm, 40 mm, and 50 mm)×50 mm was laminated via a non-conductive adhesive on each electromagnetic-wave-absorbing film piece 1, to produce Samples 31-37. In each sample, a center of the aluminum foil piece 2 was aligned with a center of the electromagnetic-wave-absorbing film piece 1. Each sample was attached to the insulation substrate 300 by an adhesive, such that a center of each sample was aligned with a center of the microstripline MSL as shown in FIG. 6, to measure the reflected wave power $S_{11}$ and the transmitted wave power $S_{12}$ to incident wave power in 0.1-6 GHz in the same manner as in Example 1, thereby determining the noise absorption ratio $P_{loss}/P_{in}$. The results are shown in FIGS. 19 to 25 and Table 3.

TABLE 3

| Sample No. | Aluminum Foil Piece | | Maximum Noise Absorption | |
|---|---|---|---|---|
| | L (mm) | Area Ratio[1] (%) | $P_{loss}/P_{in}$ | Frequency (GHz) |
| 31* | 0 | 0 | —[2] | —[2] |
| 32 | 10 | 20 | 0.97 | 2.1 |
| 33 | 20 | 40 | 0.96 | 2.1 |
| 34 | 25 | 50 | 0.97 | 2.3 |
| 35 | 30 | 60 | 0.97 | 4.0 |
| 36 | 40 | 80 | 0.97 | 4.0 |
| 37* | 50 | 100 | 0.93 | 4.2 |

Note:
[1]Area ratio of the aluminum foil piece to the electromagnetic-wave-absorbing film piece.
[2]No peak in $P_{loss}/P_{in}$.
Samples with * are Comparative Examples.

Sample 31 having no aluminum foil piece laminated on the electromagnetic-wave-absorbing film piece exhibited a flat noise absorption ratio $P_{loss}/P_{in}$ with no peak, and Sample 37 having an aluminum foil piece of the same size laminated on the electromagnetic-wave-absorbing film piece exhibited a low noise absorption ratio $P_{loss}/P_{in}$ as a whole. On the other hand, each Sample 32-36 having an aluminum foil piece with an area ratio of 20-80% laminated on the electromagnetic-wave-absorbing film piece exhibited the maximum noise absorption ratio $P_{loss}/P_{in}$ as high as 0.96-0.97 in a frequency range of 2-4 GHz (around 3 GHz). Accordingly, to maximize the noise absorption ratio $P_{loss}/P_{in}$ in a frequency range of 2-4 GHz, the area ratio of the aluminum foil piece (electromagnetic-wave-shielding film) to the electromagnetic-wave-absorbing film piece should be in a range of 10-80%, and is preferably in a range of 20-80%.

Example 7

An aluminum foil piece (thickness: 15 μm) of 25 mm×50 mm was laminated via a non-conductive adhesive on the electromagnetic-wave-absorbing film piece of 50 mm×50 mm piece used in Example 6, such that the distance D between one side $X_1$ of the electromagnetic-wave-absorbing film piece and one side $X_2$ (parallel to $X_1$) of the aluminum foil piece was 0 mm, 5 mm, 10 mm, 15 mm, 20 mm, and 25 mm, respectively, as shown in FIG. 5(a), to produce Samples 41-46. As shown in FIG. 6(a), each sample was placed on the microstripline MSL on the insulation substrate 300 to measure its noise absorption ratio $P_{loss}/P_{in}$ in a range of 0.1-6 GHz. With respect to each sample, the distance D, the noise absorption ratio $P_{loss}/P_{in}$ at 2 GHz, the maximum noise absorption ratio $P_{loss}/P_{in}$, and a frequency at the maximum noise absorption ratio are shown in Table 4.

TABLE 4

| Sample No. | D[1] (mm) | $P_{loss}/P_{in}$ at 2 GHz | Maximum $P_{loss}/P_{in}$ (GHz) |
|---|---|---|---|
| 41 | 0 | 0.45 | 0.97 (3.9) |
| 42 | 5 | 0.58 | 0.99 (3.7) |

TABLE 4-continued

| Sample No. | D[1] (mm) | $P_{loss}/P_{in}$ at 2 GHz | Maximum $P_{loss}/P_{in}$ (GHz) |
|---|---|---|---|
| 43 | 10 | 0.77 | 0.98 (4.4) |
| 44 | 15 | 0.89 | 0.97 (4.3) |
| 45 | 20 | 0.94 | 0.97 (3.7) |
| 46 | 25 | 0.93 | 1.0 (3.6) |

Note:
[1] D represents the distance between one side $X_1$ of the electromagnetic-wave-absorbing film piece and one side $X_2$ of the aluminum foil piece.

As is clear from Table 4, as the aluminum foil piece was shifted relative to the electromagnetic-wave-absorbing film piece, the $P_{loss}/P_{in}$ at 2 GHz and the maximum $P_{loss}/P_{in}$ changed drastically. This indicates that to maximize the noise absorption ratio $P_{loss}/P_{in}$ in a desired frequency range, a center of the aluminum foil piece need only be shifted from a center of the electromagnetic-wave-absorbing film piece.

Example 8

As shown in FIG. 15, a square aluminum foil piece having an area ratio of 50%, and a square-frame-shaped aluminum foil piece having an area ratio of 50% was laminated on each electromagnetic-wave-absorbing film piece of 50 mm×50 mm having a thin conductive polymer film, such that their centers were aligned, to produce Samples 51 and 52. The noise absorption ratio $P_{loss}/P_{in}$ of each sample was measured. The measurement results are shown in FIGS. 26(a) and 26(b).

Figure 26A:
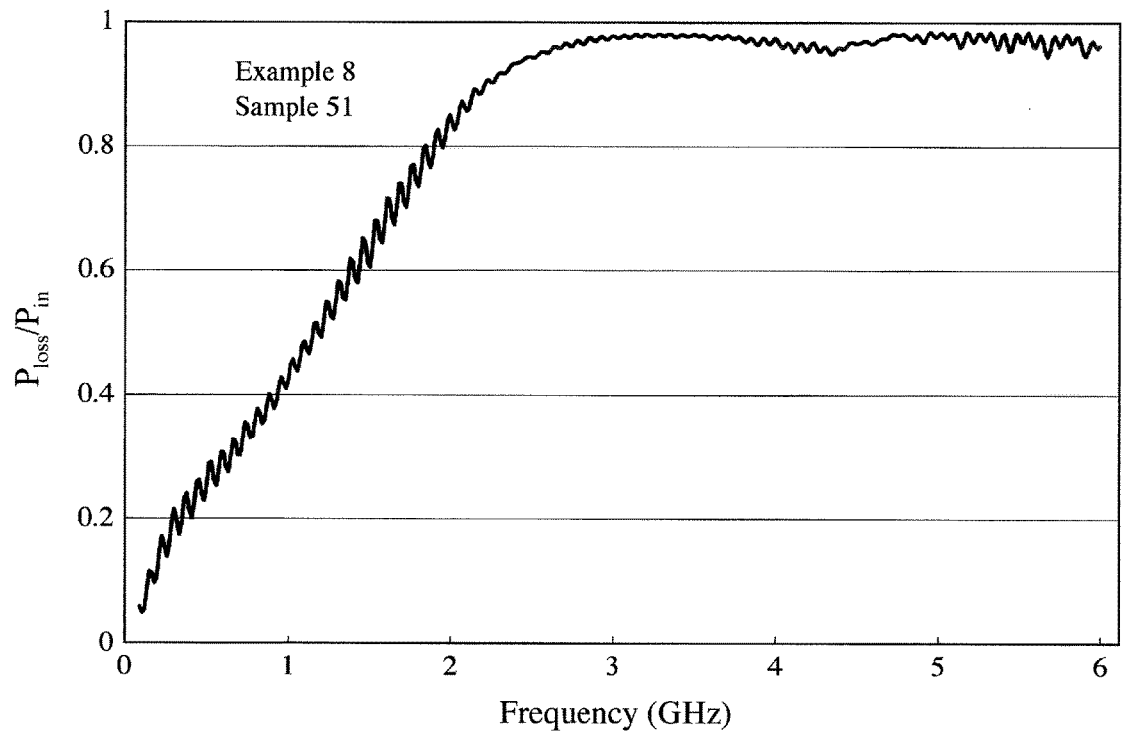
FIG. 26(a) is a graph showing the noise absorption ratio $P_{loss}/P_{in}$ of Sample 51 of the electromagnetic-wave-absorbing composite sheet comprising a square aluminum foil piece laminated on a center portion of an electromagnetic-wave-absorbing film piece having a thin conductive polymer film.
Figure 26B:
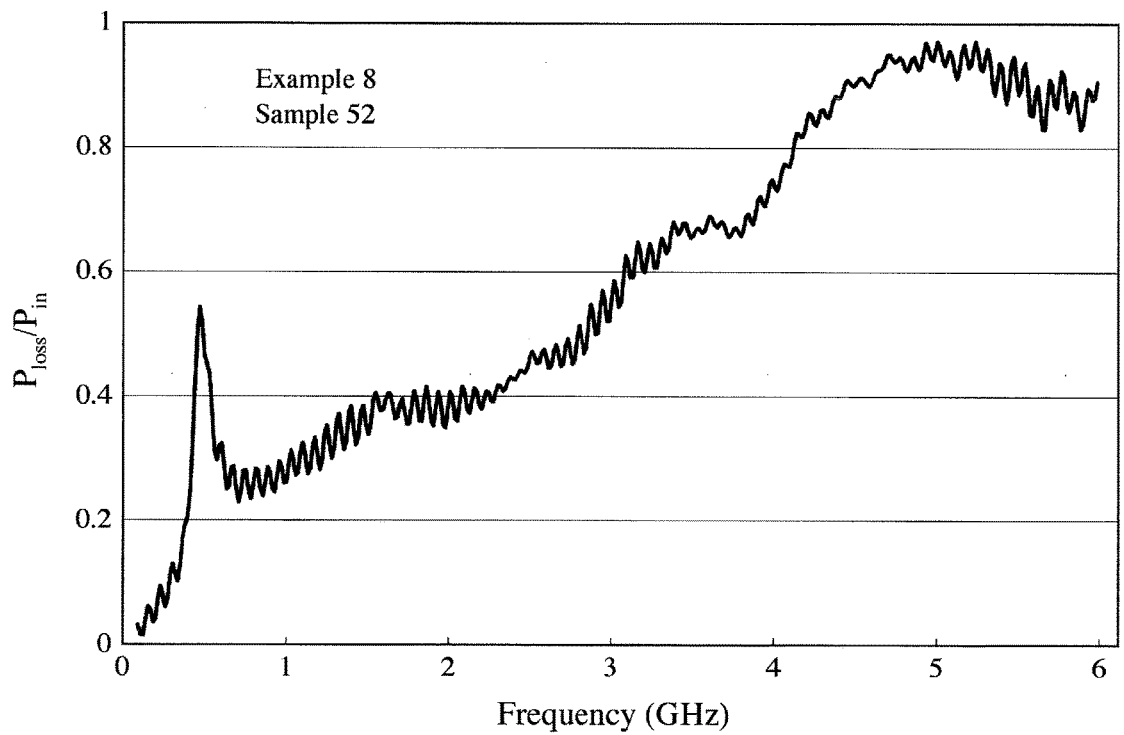
FIG. 26(b) is a graph showing the noise absorption ratio $P_{loss}/P_{in}$ of Sample 52 of the electromagnetic-wave-absorbing composite sheet comprising a square-frame-shaped aluminum foil piece laminated on an electromagnetic-wave-absorbing film piece having a thin conductive polymer film.

As is clear from FIGS. 26(a) and 26(b), Sample 51 having a laminated square aluminum foil piece with an area ratio of 50% exhibited a remarkably higher noise absorption ratio $P_{loss}/P_{in}$ than that of Sample 52 having a laminated square-frame-shaped aluminum foil piece with the same area ratio. This indicates that the aluminum foil piece is preferably positioned in a center portion of the electromagnetic-wave-absorbing film piece.

Example 9

A square electromagnetic-wave-absorbing composite sheet as large as an IC chip in Fire Stick TV of Amazon, which had the same structure as in Example 1, was produced. A rectangular aluminum foil piece had an area ratio of 50% to the electromagnetic-wave-absorbing film piece. One pair of opposing sides of the aluminum foil piece were aligned with one pair of opposing sides of the electromagnetic-wave-absorbing film piece, and a center of the laminated aluminum foil piece was aligned with a center of the electromagnetic-wave-absorbing film piece. Namely, the electromagnetic-wave-absorbing composite sheet of Example 9 had the shape shown in FIG. 1(b).

Figure 27A:
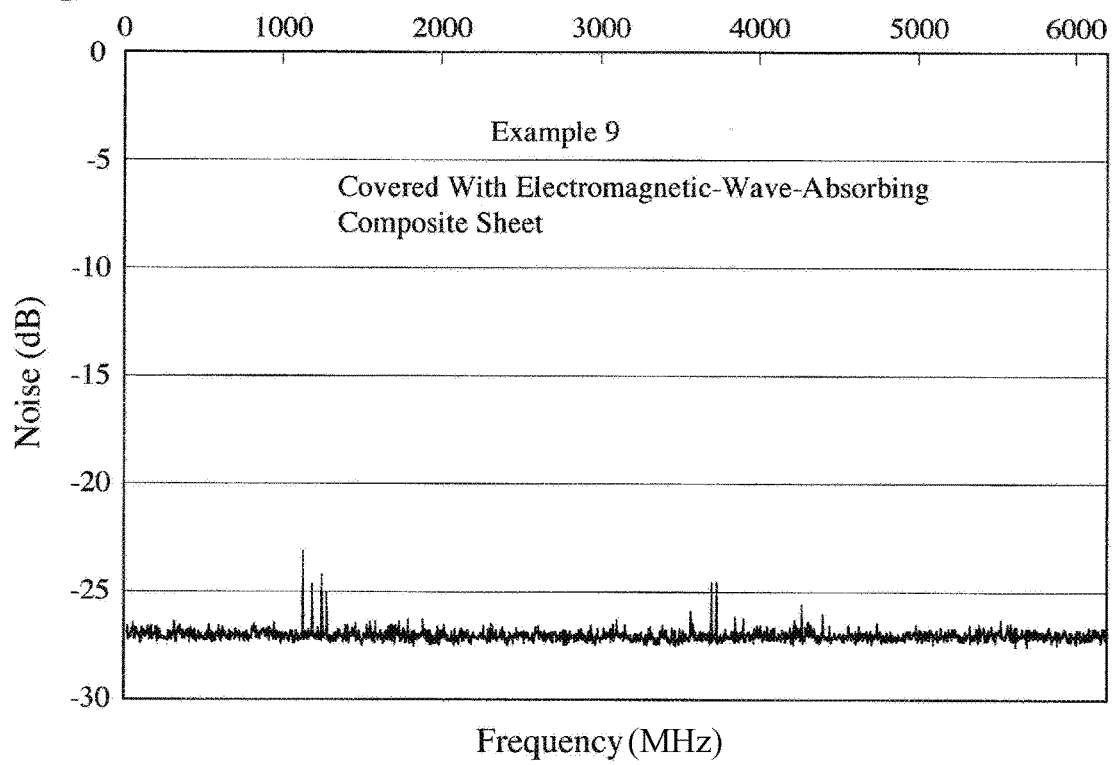
FIG. 27(a) is a graph showing electromagnetic wave noise at a frequency near 3 GHz leaking from Fire Stick TV, when an IC chip in the Fire Stick TV was covered with the electromagnetic-wave-absorbing composite sheet of Example 9.
Figure 27B:
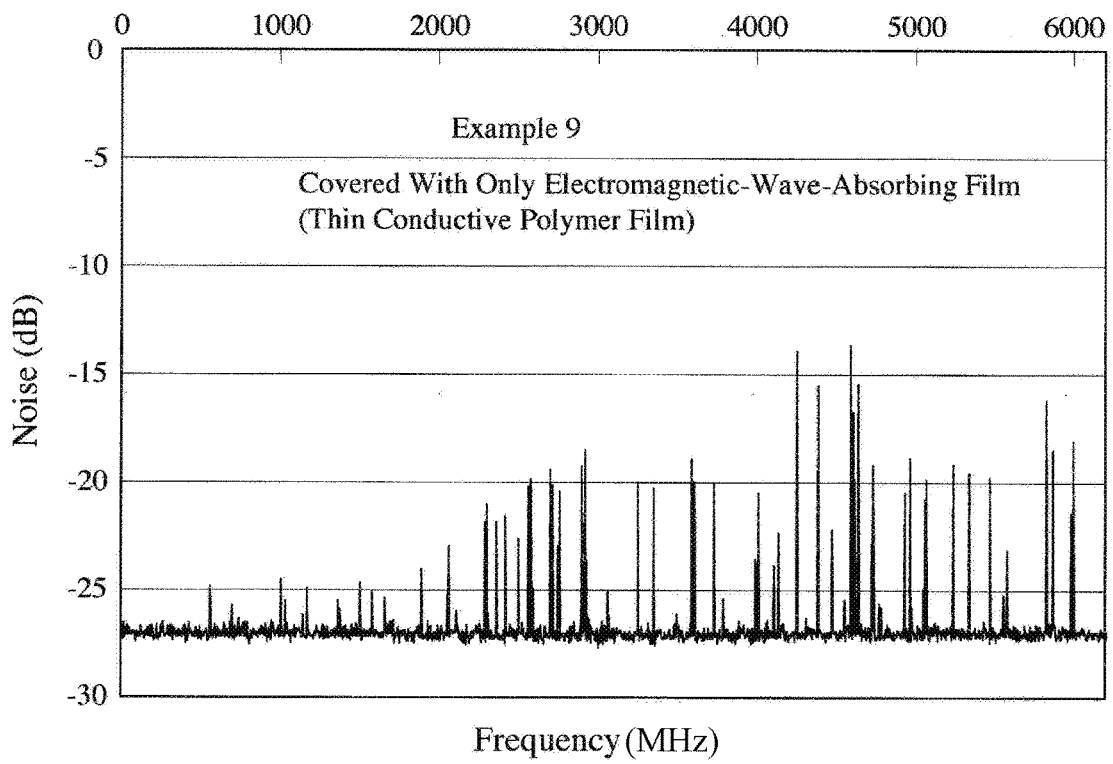
FIG. 27(b) is a graph showing electromagnetic wave noise at a frequency near 3 GHz leaking from Fire Stick TV, when an IC chip in the Fire Stick TV was covered with only an electromagnetic-wave-absorbing film having a thin conductive polymer film.

With a cover removed from the Fire Stick TV, the electromagnetic-wave-absorbing composite sheet of Example 9 was placed on the IC chip in the Fire Stick TV, to measure electromagnetic wave noise leaking from the Fire Stick TV by a spectrum analyzer VSA6G2A of Keisoku Giken Co., Ltd. The results are shown in FIG. 27(a). Also, only the same electromagnetic-wave-absorbing film piece having a thin conductive polymer film as in Example 6 was placed on the IC chip in the Fire Stick TV with a cover removed, to measure electromagnetic wave noise leaking from the Fire Stick TV. The results are shown in FIG. 27(b). As is clear from FIGS. 27(a), 27(b) and 17(c), electromagnetic wave noise at a frequency of around 3 GHz leaking from the Fire Stick TV was extremely lower when the electromagneticwave-absorbing composite sheet of the present invention was placed on the IC chip, than when only an electromagnetic-wave-absorbing film piece having a thin conductive polymer film was placed, and when no electromagnetic-wave-absorbing composite sheet was placed.

Example 10

Figure 28:
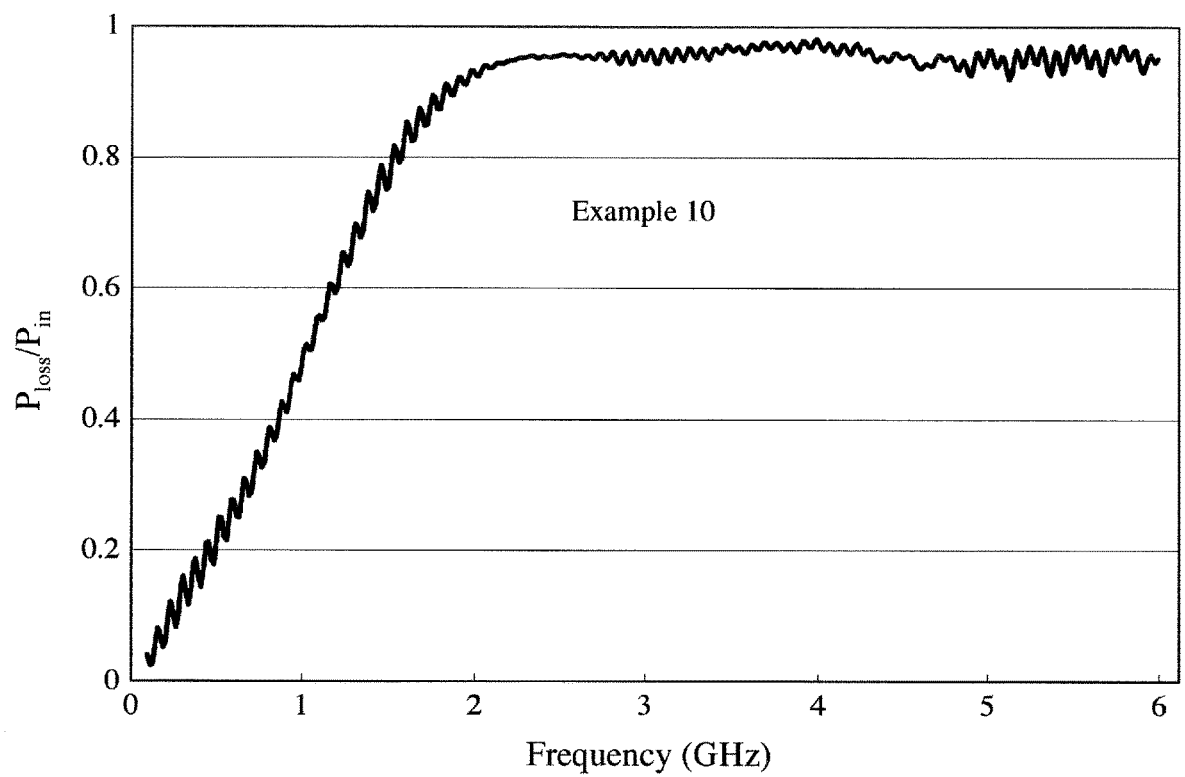
FIG. 28 is a graph showing the noise absorption ratio $P_{loss}/P_{in}$ of the electromagnetic-wave-absorbing composite sheet of Example 10 comprising a carbon sheet piece of graphite powder/carbon black as an electromagnetic-wave-shielding film.

An electromagnetic-wave-absorbing composite sheet was produced in the same manner as in Example 6, except for laminating a carbon sheet piece of graphite powder/carbon black having a size of 25 mm×50 mm in place of the aluminum foil piece on the electromagnetic-wave-absorbing film piece of 50 mm×50 mm, such that their centers were aligned. The carbon sheet of graphite powder/carbon black was produced by the same method as in Example 1 of JP 2015-170660 A. The noise absorption ratio $P_{loss}/P_{in}$ of the electromagnetic-wave-absorbing composite sheet was measured in the same manner as in Example 6. The results are shown in FIG. 28. As is clear from FIG. 28, the same results as in Example 6 were obtained, even when the carbon sheet piece was used in place of the aluminum foil piece.

Though electromagnetic-wave-absorbing composite sheets having an aluminum foil or a carbon sheet of graphite powder/carbon black laminated as electromagnetic-wave-shielding films on electromagnetic-wave-absorbing films are used in Examples above, the present invention is not restricted to these electromagnetic-wave-absorbing composite sheets, but may be modified within its scope. In addition to the aluminum foil, a copper foil, and coatings of conductive inks containing dispersed powder of aluminum, copper, silver, etc. are also usable as the electromagnetic-wave-shielding film.

EFFECTS OF THE INVENTION

The electromagnetic-wave-absorbing composite sheet of the present invention having the above structure has excellent electromagnetic wave absorbability, and can maximize electromagnetic wave noise absorbability in a desired frequency range by changing an area ratio of an electromagnetic-wave-shielding film to an electromagnetic-wave-absorbing film within a range of 10-80%. When used in electronic appliances and parts emitting electromagnetic wave noises at particular frequencies, their electromagnetic wave noises can efficiently be absorbed by such electromagnetic-wave-absorbing composite sheets.

DESCRIPTION OF REFERENCE NUMERALS

1: Electromagnetic-wave-absorbing film
2: Electromagnetic-wave-shielding film
10: Electromagnetic-wave-absorbing composite sheet
11: Plastic film
12: Thin Ni film or thin conductive polymer film
111: Electrode
112: Thin Ni film
113: Transparent acrylic plate
114: Cylindrical weight
300: Insulation substrate
301: Grounded electrode
302: Conductor pin
303: Coaxial cable
D: Distance between one side $X_1$ of electromagnetic-wave-absorbing film piece and one side $X_2$ of aluminum foil (electromagnetic-wave-shielding film) piece
MSL: Microstripline
NA: Network analyzer

What is claimed is:

1. An electromagnetic-wave-absorbing composite sheet comprising an electromagnetic-wave-absorbing film, and an electromagnetic-wave-shielding film laminated on said electromagnetic-wave-absorbing film;
    said electromagnetic-wave-absorbing film comprising a thin Ni or conductive polymer film having surface resistance in a range of 50-200 Ω/square, which is formed on a surface of a plastic film; and
    an area ratio of said electromagnetic-wave-shielding film to said electromagnetic-wave-absorbing film being 10-80%.

2. The electromagnetic-wave-absorbing composite sheet according to claim 1, wherein the area ratio of said electromagnetic-wave-shielding film to said electromagnetic-wave-absorbing film is 20-80%.

3. The electromagnetic-wave-absorbing composite sheet according to claim 1, wherein said electromagnetic-wave-shielding film is a conductive metal foil, a plastic film having a thin conductive metal film or coating, or a carbon sheet.

4. The electromagnetic-wave-absorbing composite sheet according to claim 1, wherein both of said electromagnetic-wave-absorbing film and said electromagnetic-wave-shielding film are in a rectangular or square shape.

* * * * *